United States Patent
Khan et al.

(10) Patent No.: US 9,299,634 B2
(45) Date of Patent: Mar. 29, 2016

(54) METHOD AND APPARATUS FOR COOLING SEMICONDUCTOR DEVICE HOT BLOCKS AND LARGE SCALE INTEGRATED CIRCUIT (IC) USING INTEGRATED INTERPOSER FOR IC PACKAGES

(75) Inventors: Rezaur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 113 days.

(21) Appl. No.: 11/514,917

(22) Filed: Sep. 5, 2006

(65) Prior Publication Data

US 2007/0267740 A1    Nov. 22, 2007

Related U.S. Application Data

(60) Provisional application No. 60/800,432, filed on May 16, 2006.

(51) Int. Cl.
*H01L 23/34* (2006.01)
*H01L 23/367* (2006.01)
(Continued)

(52) U.S. Cl.
CPC .......... *H01L 23/367* (2013.01); *H01L 23/3128* (2013.01); *H01L 23/4334* (2013.01); *H01L 24/48* (2013.01); *H01L 2224/16145* (2013.01); *H01L 2224/16225* (2013.01); *H01L 2224/32225* (2013.01); *H01L 2224/32245* (2013.01); *H01L 2224/48091* (2013.01); *H01L 2224/48227* (2013.01); *H01L 2224/48228* (2013.01); *H01L 2224/48247* (2013.01);
(Continued)

(58) Field of Classification Search
CPC .................... H01L 23/367; H01L 2224/48257
USPC ........... 257/717, E23.015, E23.172; 361/808; 438/487
See application file for complete search history.

(56) References Cited

U.S. PATENT DOCUMENTS

| 5,247,426 A | 9/1993 | Hamburgen et al. |
| 5,786,635 A | 7/1998 | Alcoe et al. |

(Continued)

FOREIGN PATENT DOCUMENTS

| CN | 1313637 A | 9/2001 |
| CN | 1627508 | 6/2005 |

(Continued)

OTHER PUBLICATIONS

Kim et al, Leakage Current: Moore's Law Meets Static Power, IEEE Computer, 36(12): 68-75, Dec. 2003.
(Continued)

*Primary Examiner* — Caridad Everhart
(74) *Attorney, Agent, or Firm* — Sterne, Kessler, Goldstein & Fox P.L.L.C.

(57) ABSTRACT

A method, system, and apparatus for improved IC device packaging is described. In an aspect, an (IC) device package includes an IC die having at one or more contact pads, each contact pad located at a corresponding hotspot on a surface of the IC die. The package also includes a thermally conductive interposer which is thermally coupled to the IC die at the contact pads. In another aspect, an underfill material fills a space between the IC die and the interposer. The interposer may also be electrically coupled to the IC die. In an aspect, the interposer and the IC die are coupled through thermal interconnects or "nodules."

24 Claims, 25 Drawing Sheets

(51) Int. Cl.
  *H01L 23/31* (2006.01)
  *H01L 23/433* (2006.01)
  *H01L 23/00* (2006.01)

(52) U.S. Cl.
  CPC ........... *H01L 2224/48257* (2013.01); *H01L 2224/48465* (2013.01); *H01L 2224/49109* (2013.01); *H01L 2224/73207* (2013.01); *H01L 2224/73265* (2013.01); *H01L 2924/01046* (2013.01); *H01L 2924/01079* (2013.01); *H01L 2924/10253* (2013.01); *H01L 2924/1532* (2013.01); *H01L 2924/15153* (2013.01); *H01L 2924/15311* (2013.01); *H01L 2924/15321* (2013.01); *H01L 2924/16152* (2013.01); *H01L 2924/1815* (2013.01); *H01L 2924/3025* (2013.01)

(56) References Cited

U.S. PATENT DOCUMENTS

| | | |
|---|---|---|
| 5,856,911 A | 1/1999 | Riley |
| 6,265,771 B1 | 7/2001 | Ference et al. |
| 6,294,408 B1 | 9/2001 | Edwards et al. |
| 6,303,996 B2 | 10/2001 | Lin |
| 6,313,521 B1 | 11/2001 | Baba |
| 6,337,445 B1 | 1/2002 | Abbott et al. |
| 6,395,582 B1 | 5/2002 | Sohn et al. |
| 6,462,274 B1 | 10/2002 | Shim et al. |
| 6,466,446 B1* | 10/2002 | Nagy .............. H01L 23/3732 257/675 |
| 6,483,187 B1 | 11/2002 | Chao et al. |
| 6,528,892 B2 | 3/2003 | Caletka et al. |
| 6,541,849 B1* | 4/2003 | Roohparvar .......... G11C 5/025 257/207 |
| 6,552,428 B1 | 4/2003 | Huang et al. |
| 6,570,248 B1* | 5/2003 | Ahn ............... H01L 23/49827 257/723 |
| 6,797,890 B2 | 9/2004 | Okubora et al. |
| 6,825,108 B2 | 11/2004 | Khan et al. |
| 6,848,912 B2 | 2/2005 | Zhang |
| 6,853,070 B2 | 2/2005 | Khan et al. |
| 6,861,750 B2 | 3/2005 | Zhao et al. |
| 6,876,553 B2 | 4/2005 | Zhao et al. |
| 6,879,039 B2 | 4/2005 | Khan et al. |
| 6,882,042 B2 | 4/2005 | Zhao et al. |
| 6,887,741 B2 | 5/2005 | Zhao et al. |
| 6,906,414 B2 | 6/2005 | Zhao et al. |
| 6,989,593 B2 | 1/2006 | Khan et al. |
| 7,005,737 B2 | 2/2006 | Zhao et al. |
| 7,019,972 B2* | 3/2006 | Kenny, Jr. ............... G06F 1/26 165/80.4 |
| 7,038,312 B2 | 5/2006 | Khan et al. |
| 7,078,806 B2 | 7/2006 | Khan et al. |
| 7,094,060 B2 | 8/2006 | Zhang |
| 7,102,225 B2 | 9/2006 | Khan et al. |
| 7,122,912 B2* | 10/2006 | Matsui ............... H01L 23/481 257/685 |
| 7,132,744 B2 | 11/2006 | Zhao et al. |
| 7,161,239 B2 | 1/2007 | Zhao et al. |
| 7,168,957 B2 | 1/2007 | Zhang |
| 7,193,320 B2 | 3/2007 | Hosoyamada et al. |
| 7,196,415 B2 | 3/2007 | Zhong et al. |
| 7,202,559 B2 | 4/2007 | Zhao et al. |
| 7,227,256 B2 | 6/2007 | Zhao et al. |
| 7,241,645 B2 | 7/2007 | Zhao et al. |
| 7,245,022 B2* | 7/2007 | Farooq et al. ................. 257/778 |
| 7,245,500 B2 | 7/2007 | Khan et al. |
| 7,259,448 B2 | 8/2007 | Zhang et al. |
| 7,259,457 B2 | 8/2007 | Zhang et al. |
| 7,271,479 B2 | 9/2007 | Zhao et al. |
| 7,312,108 B2 | 12/2007 | Zhao et al. |
| 7,326,061 B2 | 2/2008 | Zhang |
| 7,432,586 B2 | 10/2008 | Zhao et al. |
| 7,482,686 B2 | 1/2009 | Zhao et al. |
| 7,714,453 B2 | 5/2010 | Khan et al. |
| 7,786,591 B2 | 8/2010 | Khan et al. |
| 7,791,189 B2 | 9/2010 | Zhao et al. |
| 2002/0006686 A1 | 1/2002 | Cloud et al. |
| 2002/0079572 A1 | 6/2002 | Khan et al. |
| 2002/0109226 A1* | 8/2002 | Khan et al. .................. 257/737 |
| 2002/0190361 A1 | 12/2002 | Zhao et al. |
| 2003/0092205 A1 | 5/2003 | Wu et al. |
| 2003/0137057 A1 | 7/2003 | Honda |
| 2003/0139071 A1* | 7/2003 | Li et al. ...................... 439/66 |
| 2003/0146509 A1 | 8/2003 | Zhao et al. |
| 2003/0146520 A1 | 8/2003 | Fang |
| 2003/0183950 A1* | 10/2003 | Bolken ........................ 257/786 |
| 2003/0193791 A1* | 10/2003 | Panella et al. ................ 361/764 |
| 2003/0202332 A1 | 10/2003 | Reinikainen et al. |
| 2005/0012203 A1 | 1/2005 | Rahman et al. |
| 2005/0029657 A1 | 2/2005 | Khan et al. |
| 2005/0035452 A1 | 2/2005 | Zhang et al. |
| 2005/0040539 A1* | 2/2005 | Carlsgaard ..................... 257/778 |
| 2005/0077545 A1 | 4/2005 | Zhao et al. |
| 2005/0127500 A1 | 6/2005 | Colgan et al. |
| 2005/0127501 A1 | 6/2005 | Khan et al. |
| 2005/0133930 A1* | 6/2005 | Savastisuk ............ H01L 23/147 257/774 |
| 2005/0170600 A1* | 8/2005 | Fukuzo ............... H01L 25/0657 438/396 |
| 2005/0191786 A1* | 9/2005 | Cohen .................... C25D 5/022 438/106 |
| 2005/0224955 A1 | 10/2005 | Desai et al. |
| 2005/0242426 A1 | 11/2005 | Kwon et al. |
| 2005/0257821 A1* | 11/2005 | Ramanathan ........... H01L 23/38 136/203 |
| 2005/0280127 A1 | 12/2005 | Zhao et al. |
| 2005/0280139 A1 | 12/2005 | Zhao et al. |
| 2005/0280141 A1* | 12/2005 | Zhang ........................... 257/707 |
| 2006/0065922 A1* | 3/2006 | Kleint et al. ................... 257/324 |
| 2006/0065972 A1 | 3/2006 | Khan et al. |
| 2006/0086487 A1* | 4/2006 | Yang et al. ..................... 165/146 |
| 2006/0091509 A1 | 5/2006 | Zhao et al. |
| 2006/0091542 A1 | 5/2006 | Zhao et al. |
| 2007/0007644 A1 | 1/2007 | Zhao et al. |
| 2007/0023880 A1 | 2/2007 | Hess et al. |
| 2007/0040267 A1 | 2/2007 | Zhao et al. |
| 2007/0045824 A1 | 3/2007 | Zhao et al. |
| 2007/0090502 A1 | 4/2007 | Zhao et al. |
| 2007/0108598 A1 | 5/2007 | Zhong et al. |
| 2007/0139889 A1* | 6/2007 | Ouyang ........................ 361/701 |
| 2007/0200210 A1 | 8/2007 | Zhao et al. |
| 2007/0267734 A1 | 11/2007 | Zhao et al. |
| 2007/0273023 A1 | 11/2007 | Zhao et al. |
| 2007/0273049 A1 | 11/2007 | Khan et al. |
| 2007/0278632 A1 | 12/2007 | Zhao et al. |
| 2007/0290322 A1 | 12/2007 | Zhao et al. |
| 2007/0290376 A1 | 12/2007 | Zhao et al. |
| 2008/0006934 A1 | 1/2008 | Zhao et al. |
| 2010/0285637 A1 | 11/2010 | Khan et al. |

FOREIGN PATENT DOCUMENTS

| CN | 1697169 | 11/2005 |
| WO | WO 03/081669 A1 | 10/2003 |
| WO | WO 2005/104314 | 11/2005 |

OTHER PUBLICATIONS

2004 International Technology Roadmap for Semiconductors (ITRS Roadmap) (http://www.itrs.net/Common/2004Update/2004_00_Overview.pdf).

Shakouri and Zhang, "On-Chip Solid-State Cooling for Integrated Circuits Using Thin-Film Microrefrigerators," IEEE Transactions on Components and Packaging Technologies, vol. 28, No. 1, Mar. 2005, pp. 65-69.

Zhao and Avedisian, Enhancing Forced Air Convection Heat Transfer From an Array of Parallel Plate Fins Using a Heat Pipe, Int. J. Heat Mass Transfer, vol. 40, No. 13, pp. 3135-3147 (1997).

Bush, "Fluid Cooling Plugs Direct onto CMOS," Electronic News, Jul. 20, 2005, http://www.reedelectronics.com/electronicnews/article/CA626959?nid=2019&rid=550846255).

(56) References Cited

OTHER PUBLICATIONS

Singer, "Chip Heat Removal with Microfluidic Backside Cooling," Electronic News, Jul. 20, 2005.
Snyder et al, "Hot Spot Cooling using Embedded Thermoelectric Coolers," 22nd IEEE SEMI-THERM, Symposium, pp. 135-143 (2006).
English Abstract of CN1697169, publication date of Nov. 15, 2005.
Office Action cited in U.S. Appl. No. 11/514,916, filed Sep. 5, 2006, dated May 29, 2009.
Jian, C. et al., "SoC Test Scheduling with Hot-Spot Avoidance and Even Distribution," *Journal of Computer-Aided Design & Computer Graphics*, vol. 18, No. 1, Jan. 2006, pp. 46-52.
Office Action, dated Dec. 9, 2009, for U.S. Appl. No. 11/514,916, filed Sep. 5, 2006, 17 pages.
Advisory Action, dated May 12, 2010, for U.S. Appl. No. 11/514,916, filed Sep. 5, 2006.
Advisory Action, dated Mar. 17, 2010, for U.S. Appl. No. 11/514,916, filed Sep. 5, 2006.
Office Action, dated Nov. 24, 2010, for U.S. Appl. No. 11/514,916, filed Sep. 5, 2006.
Office Action, dated Apr. 14, 2011, for U.S. Appl. No. 11/514,916, filed Sep. 5, 2006; 12 pages.
Office Action, dated Jul. 24, 2014, for U.S. Appl. No. 11/514,916, filed Sep. 5, 2006; 11 pages.
Notice of Allowance, dated Dec. 11, 2014, for U.S. Appl. No. 11/514,916, filed Sep. 5, 2006; 8 pages.
Zhao et al., U.S. Appl. No. 14/668,276, filed Mar. 25, 2015, entitled "Thermal Improvement for Hotspots on Dies in Integrated Circuit Packages," 29 pages.
English language Abstract of Chinese Patent Publication No. CN 1313637 A, published Mar. 11, 2011; 2 pages.
Taiwanese Office Action directed to related Taiwanese Patent Application No. 096122029, mailed Aug. 16, 2012; 6 pages.

\* cited by examiner

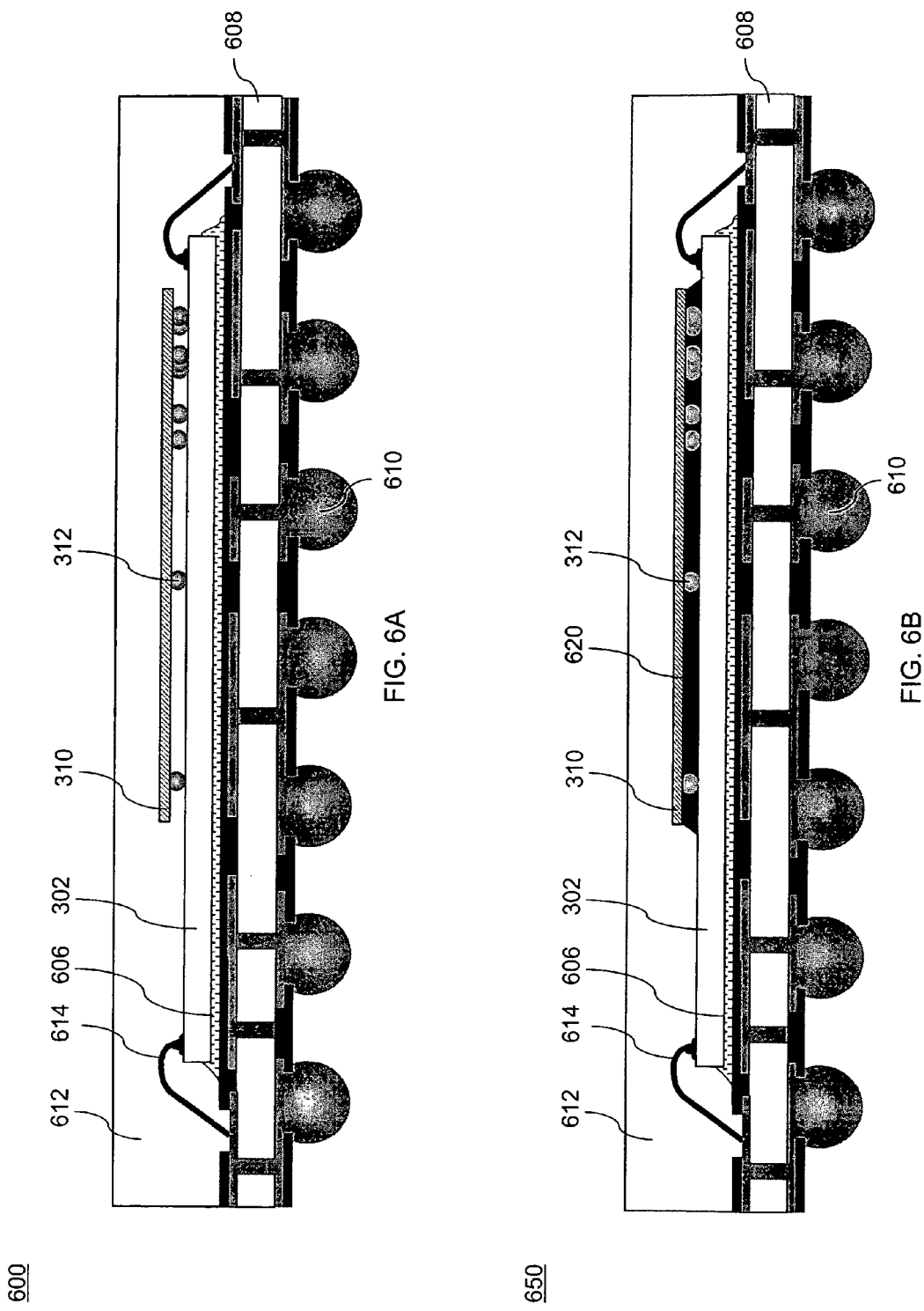

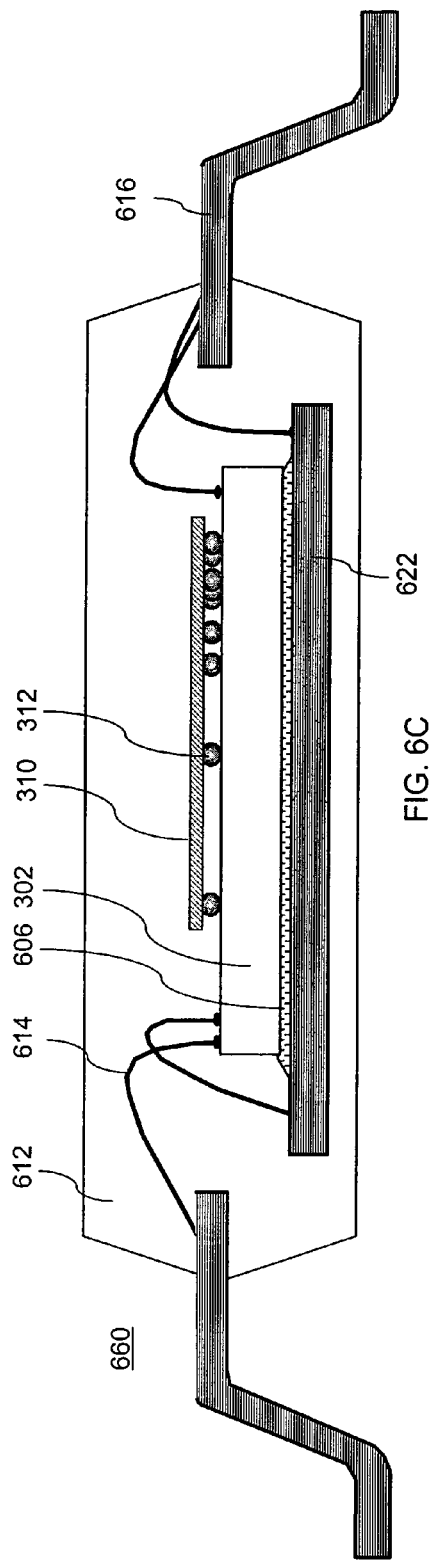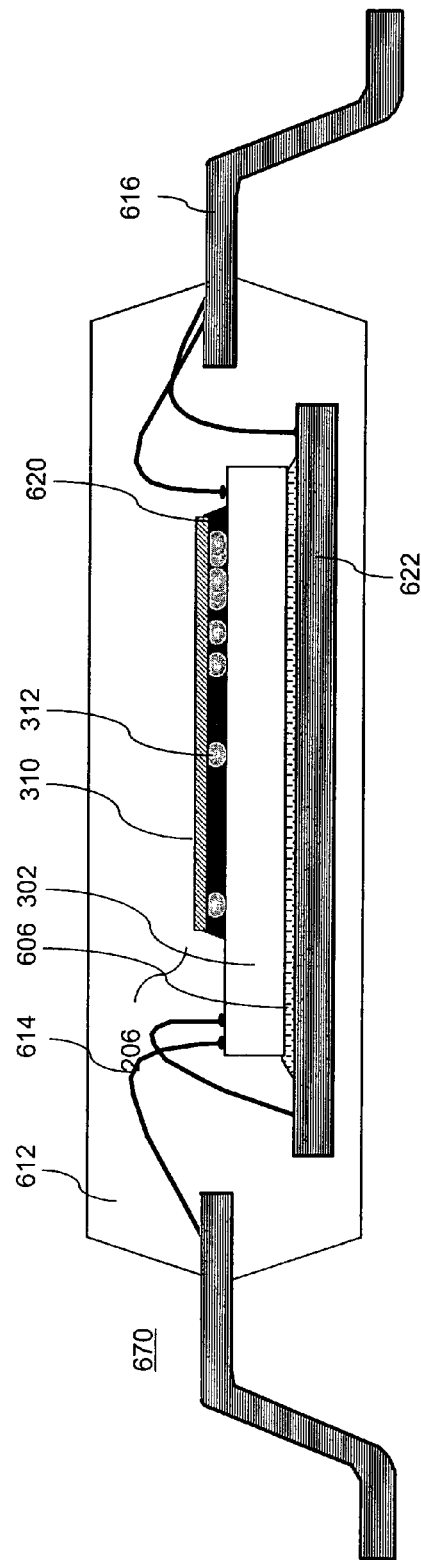

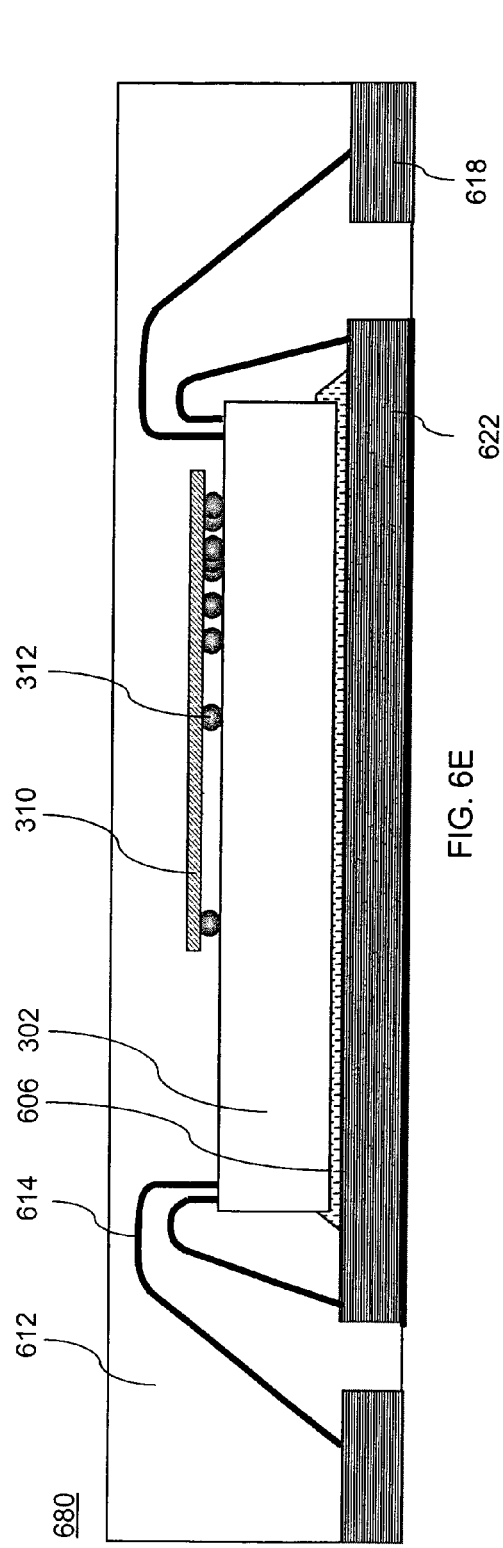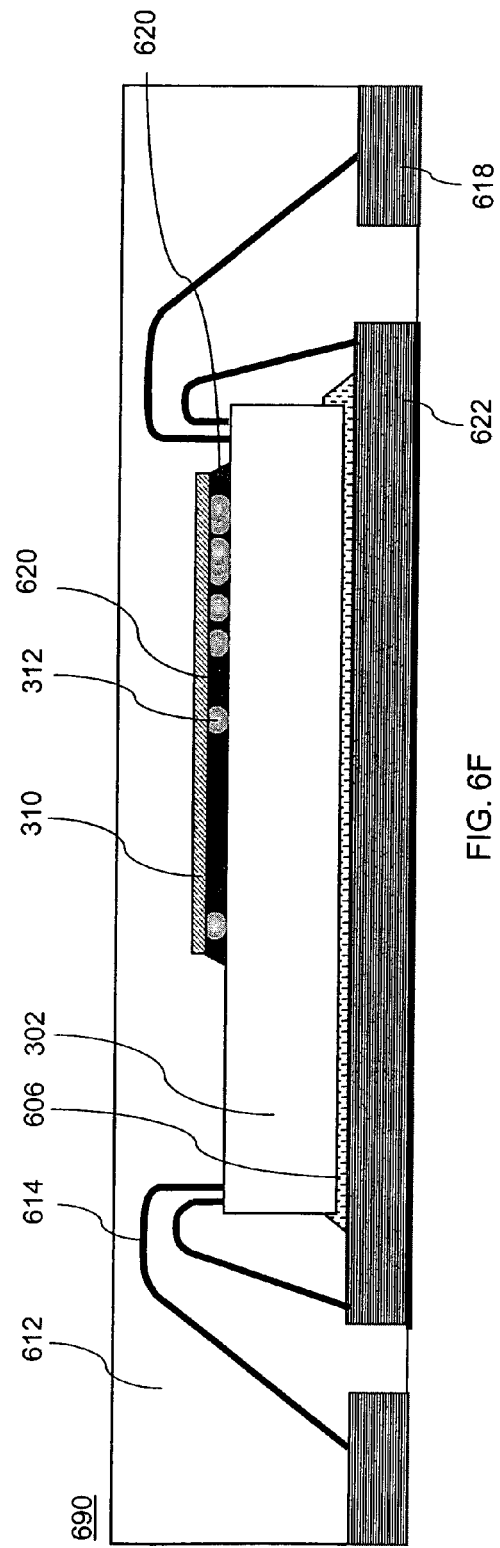

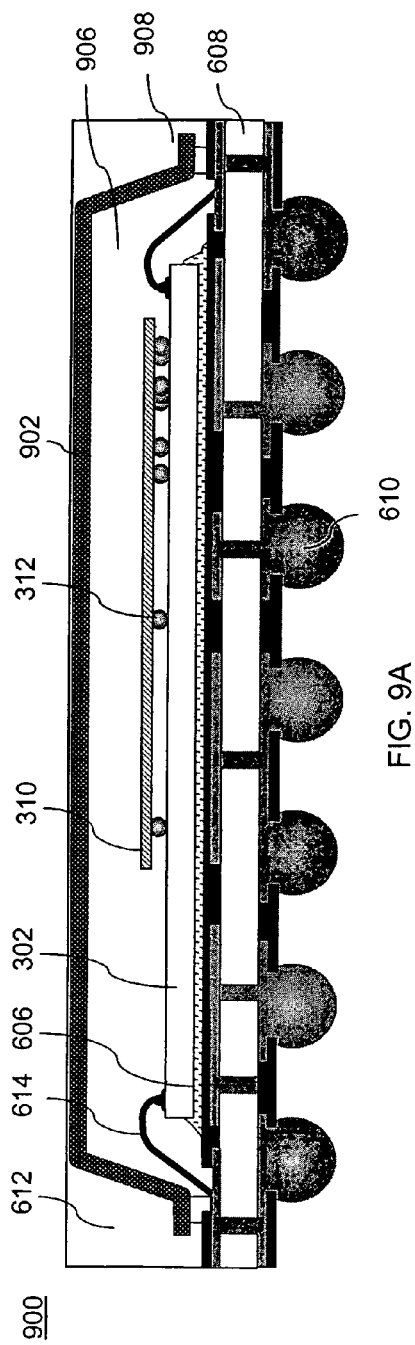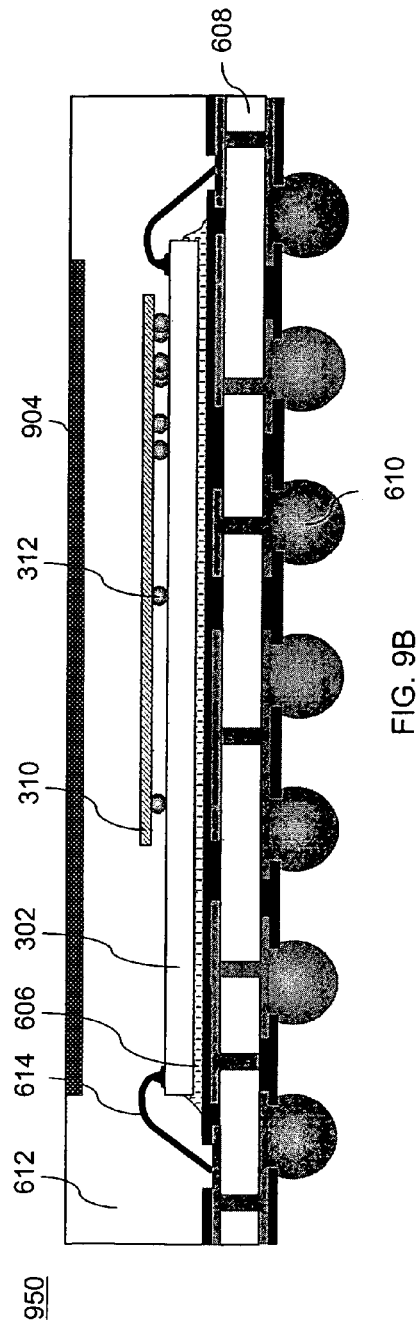

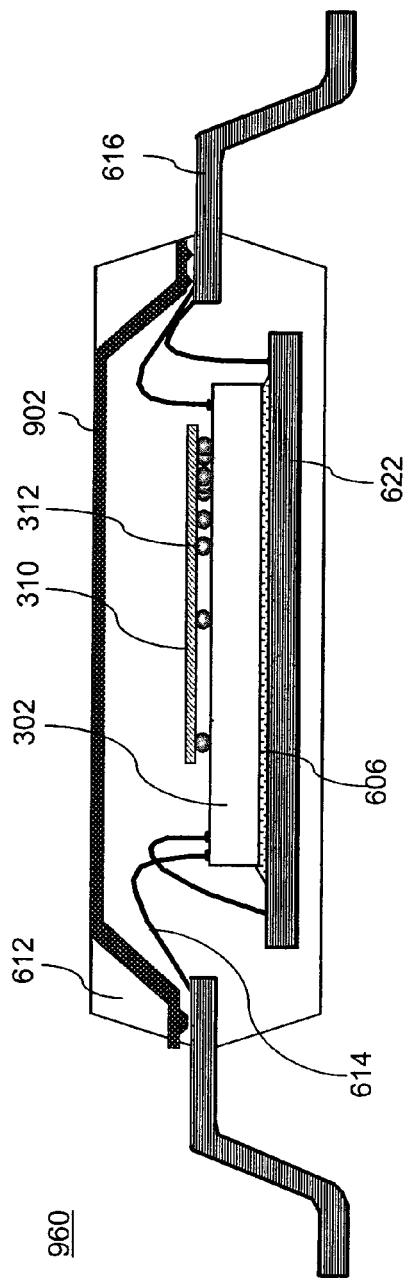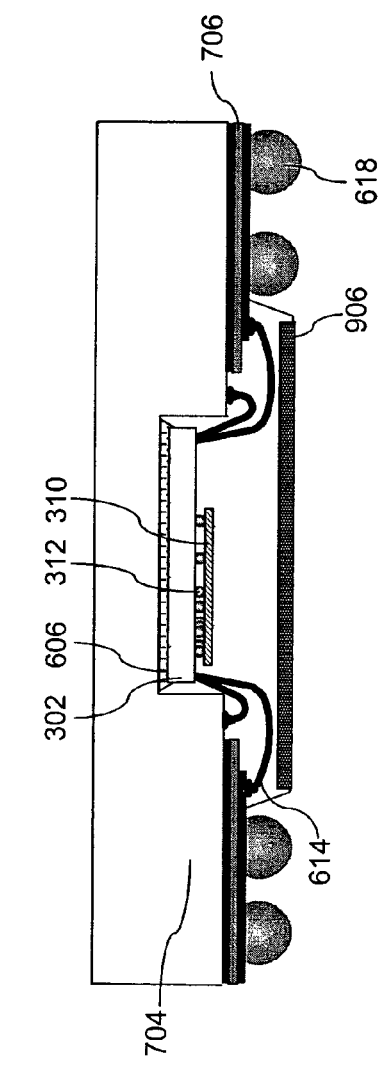
FIG. 9C
FIG. 9D

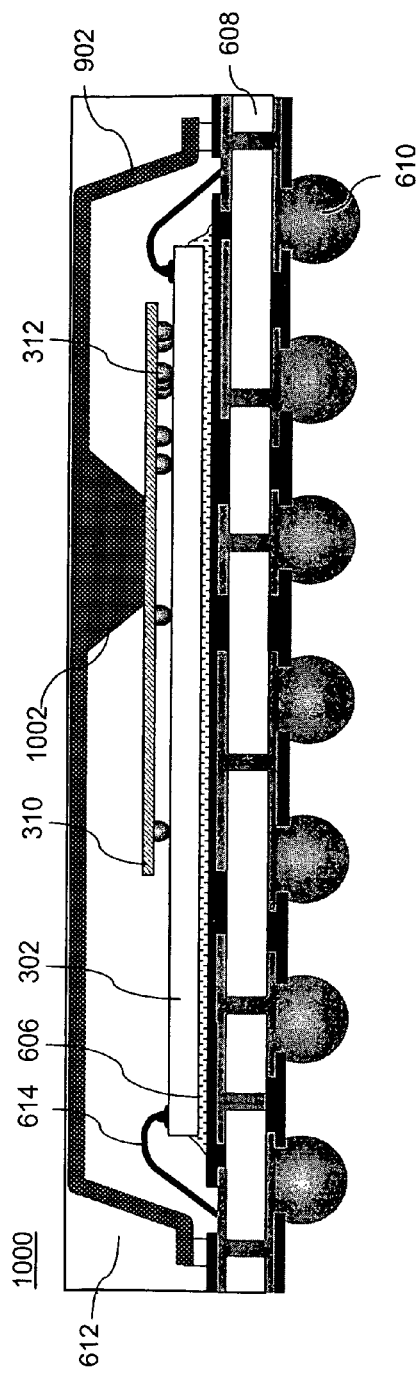
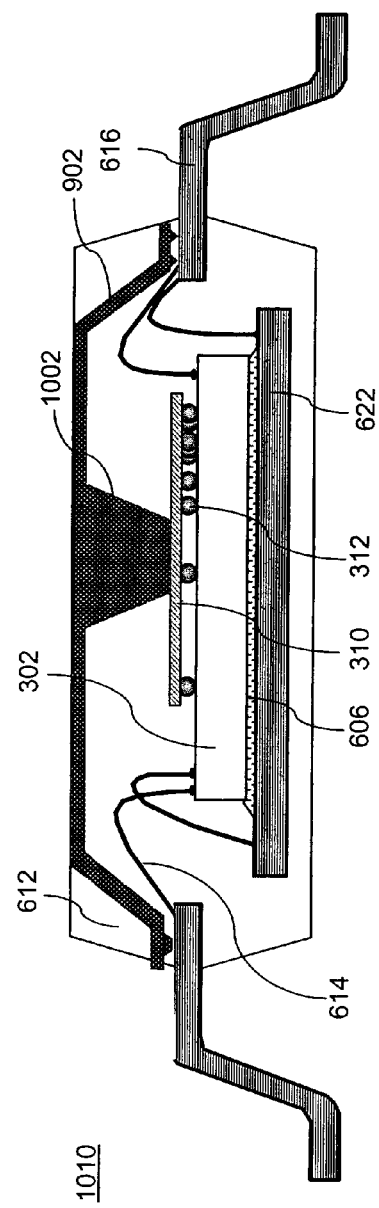
FIG. 10A
FIG. 10B

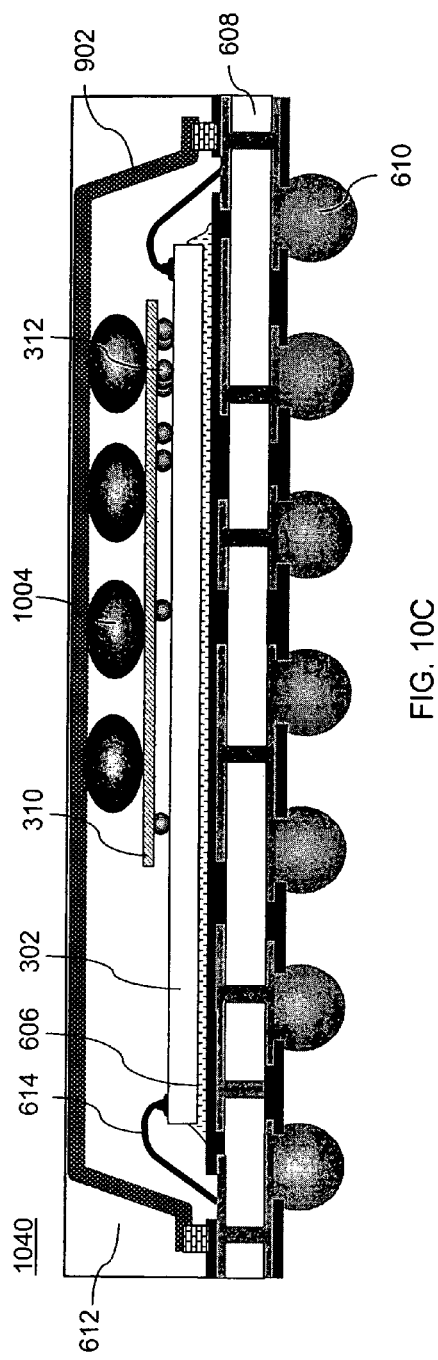
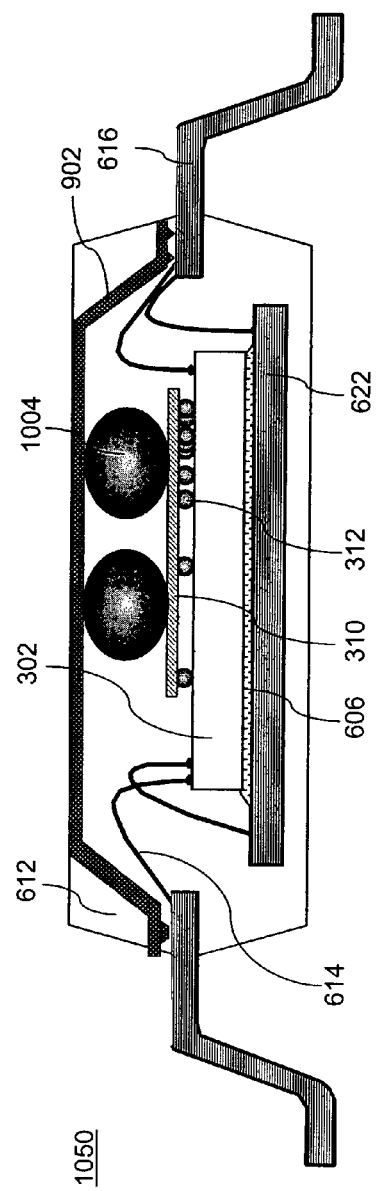
FIG. 10C
FIG. 10D

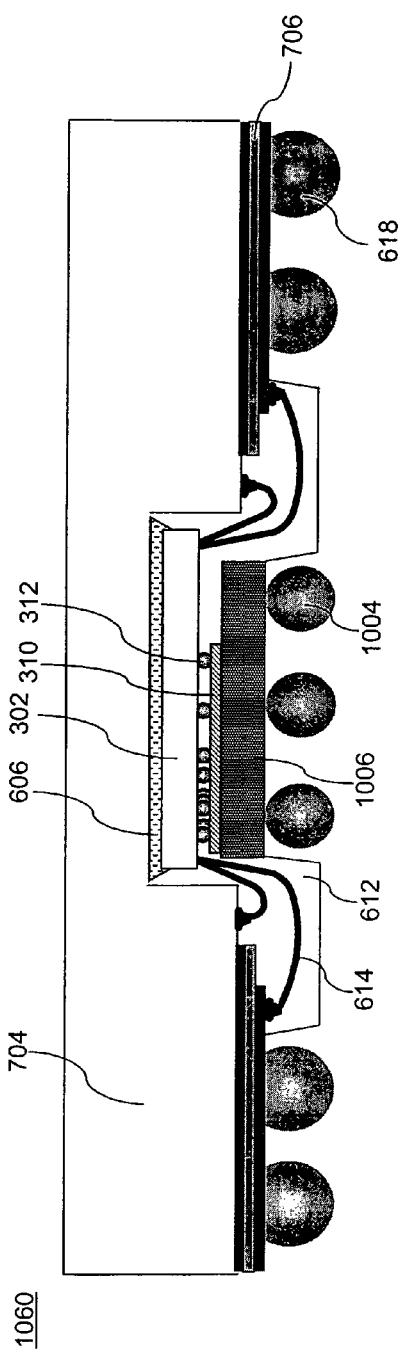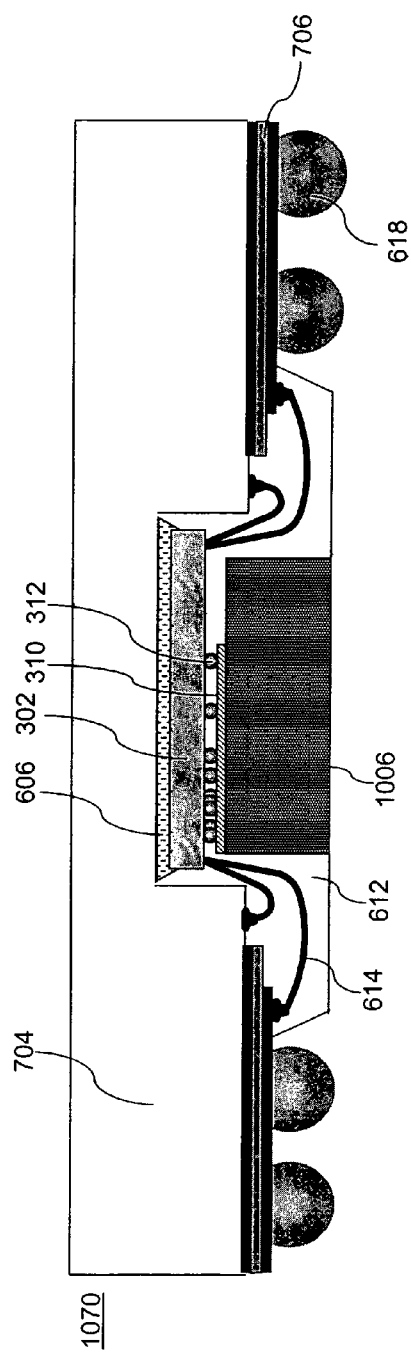

METHOD AND APPARATUS FOR COOLING SEMICONDUCTOR DEVICE HOT BLOCKS AND LARGE SCALE INTEGRATED CIRCUIT (IC) USING INTEGRATED INTERPOSER FOR IC PACKAGES

This application claims the benefit of U.S. Provisional Appl. No. 60/800,432, filed May 16, 2006, which is incorporated by reference herein in its entirety.

BACKGROUND OF THE INVENTION

1. Field of the Invention

The invention relates generally to the field of integrated circuit (IC) device packaging technology, and more particularly to the cooling of hotspots on IC semiconductor die, heat spreading for molded plastic IC packages, and thermal interconnection technology in IC packaging.

2. Background Art

Electronic signals are carried by electrical current through conductors and transistors in a large scale integrated circuit (IC) fabricated on semiconductor substrate. The energy carried by the electrical current is partially dissipated along the paths of current flow through the IC in the form of heat. Heat generation in electronic semiconductor ICs is also known as power consumption, power dissipation, or heat dissipation. The heat generated, P, in an IC is the sum of dynamic power, $P_D$, and static power, $P_S$:

$$P = P_D + P_S = ACV_2f + VI_{leak}$$

where A is the gate activity factor, C is the total capacitance load of all gates, $V_2$ is the peak-to-peak supply voltage swing, f is the frequency, and $I_{leak}$ is the leakage current. The static power term, $P_S = VI_{leak}$, is the static power dissipated due to leakage current, $I_{leak}$. A further description regarding static power is provided in Kim et al, Leakage Current: Moore's Law Meets Static Power, IEEE Computer, 36(12): 68-75, December 2003, which is incorporated by reference herein in its entirety.

The dynamic power term, $P_D = ACV_2f$, is the dynamic power dissipated from charging and discharging the IC device capacitive loads. Dynamic power consumption is thus proportional to the operating frequency and the square of operating voltage. Static power consumption is proportional to the operating voltage. Advances in transistor gate size reduction in semiconductor IC technology have reduced the operating voltage and power dissipation for single transistors. However, on-chip power densities are expected continue to rise in future technologies as the industry continues to follow the trend set forth by Moore's Law. In 1965, Intel co-founder Gordon Moore predicted that the number of transistors on a chip doubles about every two years. In addition to the increased number of transistors on a chip, the operating frequencies also double about every two years according to the 2004 International Technology Roadmap for Semiconductors (ITRS Roadmap) (http://www.itrs.net/Common/2004Update/2004_00_Overview.pdf). Because of the increased difficulties in controlling noise margins as voltage decreases, operating voltages can no longer be reduced as quickly as in the past for 130 nm gate lengths and smaller. Consequently, on-chip power dissipation will continue to rise. See Table 6 of the ITRS Roadmap. With the increased use of 65 nm technology in foundry processes and the commercialization of 45 nm technology, power consumption is now a major technical problem facing the semiconductor industry.

Another characteristic of IC chips is the uneven distribution of temperature on a semiconductor die. More and more functional blocks are integrated in a single chip in system-on-chip (SOC) designs. Higher power density blocks create an uneven temperature distribution and lead to "hotspots," also known as "hot blocks," on the chip. Hotspots can lead to a temperature difference of about 5° C. to roughly 30° C. across a chip. Further description of hotspots is provided in Shakouri and Zhang, "On-Chip Solid-State Cooling For Integrated Circuits Using Thin-Film Microrefrigerators," IEEE Transactions on Components and Packaging Technologies, Vol. 28, No. 1, Mar., 2005, pp. 65-69, which is incorporated by reference herein in its entirety.

Since carrier mobility is inversely proportional to temperature, the clock speed typically must be designed for the hottest spot on the chip. Consequently, thermal design is driven by the temperature of these on-chip hotspots. Also, if uniform carrier mobility is not achieved across the IC die due to on-chip temperature variations across the die, this may result in variations in signal speed and in complicating circuit timing control.

Heat spreaders, including drop-in heat spreaders, heat sinks, and heat pipes have been used in the past to enhance thermal performances of IC packages. Further descriptions of example heat spreaders are provided in U.S. Pat. No. 6,552,428, entitled "Semiconductor Package Having An Exposed Heat Spreader", issued Apr. 22, 2003, which is incorporated by reference herein in its entirety. Further descriptions of example heat pipes are provided in Zhao and Avedisian, "Enhancing Forced Air Convection Heat Transfer From An Array Of Parallel Plate Fins Using A Heat Pipe, Int. J. Heat Mass Transfer, Vol. 40, No. 13, pp. 3135-3147 (1997).

For example, FIG. 1 shows a die up plastic ball grid array (PBGA) package 100 integrated with a drop-in heat spreader 104. In package 100, IC die 102 is attached to a substrate 110 by die attach material 106 and is interconnected with wirebond 114. Package 100 can be connected to a printed wire board (PWB) (not shown) by solder balls 108. A drop-in heat spreader 104 is mounted to substrate 110, and conducts heat away from die 102. Mold compound 112 encapsulates package 100, including die 102, wirebond 114, all or part of drop-in heat spreader 104, and all or part of the upper surface of substrate 110. Drop-in heat spreader 104 is commonly made of copper or other material that is thermally more conductive than mold compound 112. Thermal conductivity values are around 390 W/m*° C. for copper and 0.8 W/m*° C. for mold compound materials, respectively.

Thermal enhancement methods, such as shown in FIG. 1, rely on heat removal from the entire chip or from the entire package. They maintain semiconductor temperature below the limit of operation threshold by cooling the entire chip indiscriminately. These methods are often ineffective and inadequate to reduce the temperature of the hotspots relative to the rest of the chip, such that operation of the chip is still limited by the hotspots.

For example, FIG. 2A shows a perspective view of a silicon die 102, and in particular shows the temperature distribution on silicon die 102 in a PBGA with no external heat sink. The temperature difference across the die 102 is 13.5° C. FIG. 2B shows die 102 of FIG. 2A, illustrating the effect of adding a drop in heat spreader and a heat sink to the package of die 102. The temperature difference remains 13.0° C. with a large size (45 mm×45 mm×25 mm) external aluminum pin-fin heat sink attached on top of the exposed drop-in heat spreader. Both the drop-in heat spreader and the external heat sink are ineffective to reduce the on-chip temperature differences caused by the hot spots.

Active on-chip cooling methods that use electrical energy to remove heat from the IC chip are known in the art. For example, some have suggested pumping liquid coolant through micro-channels engraved in silicon to circulate on the semiconductor die and carry away waste heat. A further description regarding liquid cooling is provided in Bush, "Fluid Cooling Plugs Direct onto CMOS," Electronic News, Jul. 20, 2005, http://www.reed-electronics.com/electronic-news/article/CA626959?nid=2019&rid=550846255), which is incorporated by reference herein in its entirety. See also Singer, "Chip Heat Removal with Microfluidic Backside Cooling," Electronic News, Jul. 20, 2005, which is incorporated by reference herein in its entirety.

Other active cooling methods have been developed in an attempt to provide active on-chip cooling using a thin-film thermoelectric cooler (TEC). A further description regarding on-chip cooling with TECs is provided in Snyder et al, "Hot Spot Cooling using Embedded Thermoelectric Coolers," 22nd IEEE SEMI-THERM, Symposium, pp. 135-143 (2006), which is incorporated by reference herein in its entirety.

These active cooling methods require exotic and expensive fluid circulation or micro-refrigeration systems and add to the total power consumption of the package that must be removed. A separate power supply must also be integrated into the IC package to drive the fluid pumping or the TEC systems. These can be costly and can decrease component reliability. Because these solutions are typically expensive, their use is limited in cost sensitive applications such as consumer electronic devices.

These cooling methods as discussed above are inadequate and/or difficult and expensive to implement for commercial applications. What is needed is an inexpensive and reliable system and method of selective heat removal from hot blocks or hotspots on semiconductor dice.

BRIEF SUMMARY OF THE INVENTION

Methods, systems, and apparatuses for improved integrated circuit packages are described herein.

In an aspect of the invention, an integrated circuit (IC) device package includes an IC die having at least one contact pad, each contact pad located at a corresponding hotspot. The package also includes a thermally conductive interposer which is thermally coupled to the IC die. In another aspect of the invention, there is underfill material between the IC die and the interposer.

In an aspect of the invention, the interposer is also electrically coupled to the IC die. In another aspect of the invention, the interposer and the IC die are coupled through thermal interconnect members (also referred to as thermal interconnects or nodules). In embodiments, the IC package may be a die up or a die down design.

In an aspect of the invention, a heat spreader is thermally coupled to the interposer. In another aspect of the invention, the heat spreader is also electrically coupled to the interposer. In yet another aspect of the invention, the heat spreader is thermally and/or electrically coupled to the interposer through solder balls or a heat slug.

In an aspect of the invention, the heat slug is configured to be coupled to a Printed Circuit Board (PCB). In another aspect of the invention, the interposer is configured to be coupled to a PCB.

In an aspect of the invention, an IC package is assembled by a method which includes thermally coupling an interposer to an IC die through at least one nodule on a corresponding contact pad. In an aspect of the invention, the interposer is bumped prior to being thermally coupled to the IC die. In another aspect of the invention, the IC die is bumped prior to being thermally coupled to the interposer. In another aspect of the invention, the IC die and interposer are electrically coupled.

In an aspect of the invention, a space between the interposer and the IC die is underfilled with an underfilling material. In an aspect of the invention, the interposer is thermally coupled to a heat slug, heat spreader, heat sink, another interposer, or solder balls.

In an aspect of the invention, the IC package is assembled so that it is capable of being mounted to a PCB. In another aspect of the invention, the IC package is assembled so that the package is capable of being thermally coupled to a PCB. In another aspect, the package is assembled so that it is capable of being electrically coupled to a PCB.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 6A-6F illustrate Integrated Circuit (IC) packages having an interposer, according to exemplary embodiments of the invention.

FIGS. 9A-9D illustrate IC packages having an interposer and a heat spreader, according to example embodiments of the invention.

FIGS. 10A-10F illustrate IC packages having an interposer coupled to a heat slug or solder balls, according to example embodiments of the invention.

Figure 1:
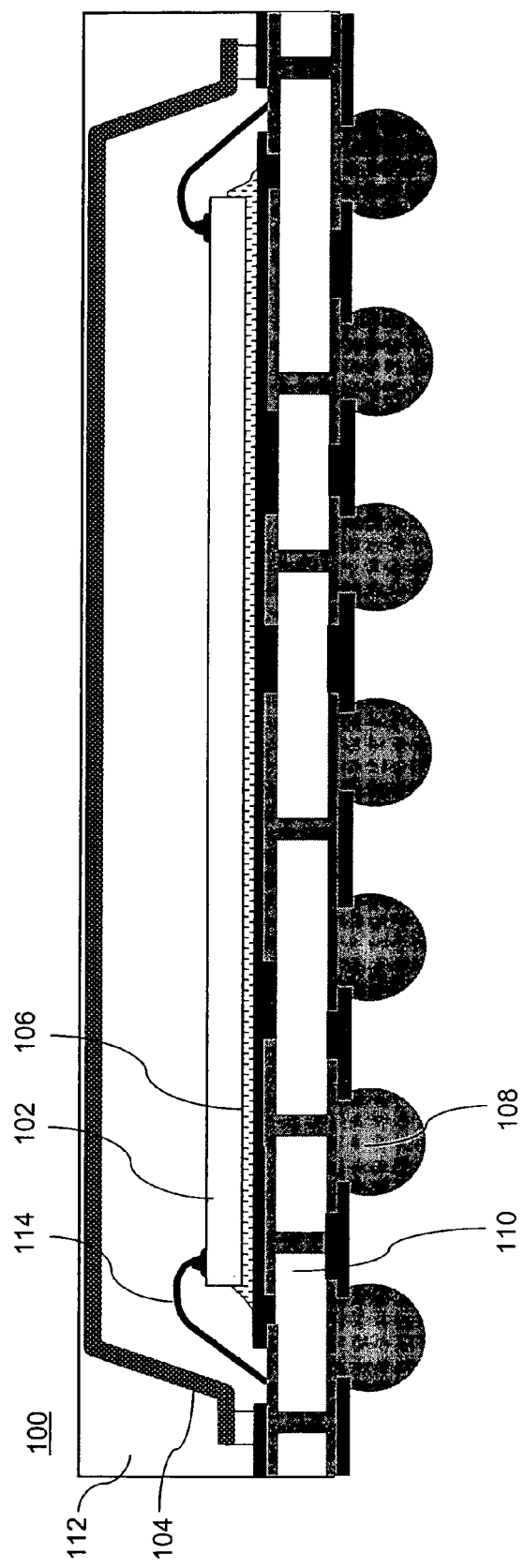
FIG. 1 illustrates a cross-sectional view of a conventional die up BGA package with a heat spreader.
Figures 2A, 2B:
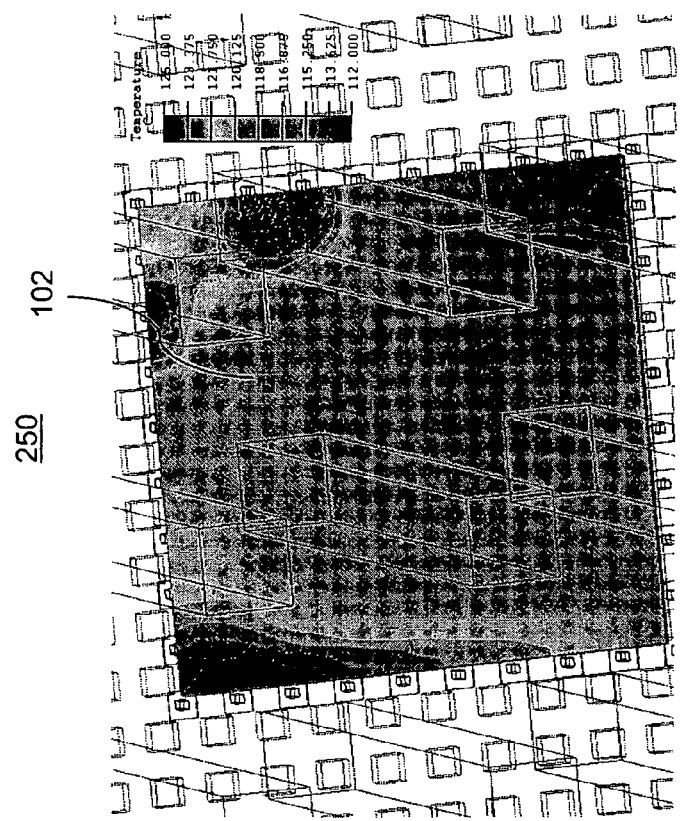
FIG. 2A-2B illustrate the surface temperature of an IC die in operation using conventional cooling methods.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present invention is directed to improved Integrated Circuit (IC) packages and methods for making the same. In particular, IC packages are described herein having improved heat removal from hotspots on an IC die. According to an exemplary embodiment of the present invention, a thermally conductive interposer is coupled to an IC die at contact pads, at least one of which is located at a hotspot. The interposer thus conducts heat from the IC die hotspots in particular and the IC die generally, reducing the overall temperature of the die and reducing the difference in temperature across the die.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Example Embodiments

The present invention relates to the selective removal of heat from localized areas on an integrated circuit (IC) die. In an embodiment, a thermally conductive interposer structure is coupled to at least one contact pad on an IC die. The contact pad(s) are located at hotspots on the die. In further embodiments, the interposer is electrically and/or thermally conductive. In embodiments, the interposer is coupled to the die through thermal interconnect members (also referred to as thermal interconnects or nodules), which are thermally conductive balls, bumps, or blocks which are attached onto the interposer and/or the IC die during assembly. In a further embodiment, the nodules are thermally and/or electrically conductive. In an embodiment, the interposer is thermally and/or electrically coupled to the IC die.

In an embodiment, the interposer is coupled to an IC die at selected locations, such as blocks (e.g., areas on the surface of the die) with a high density of power dissipation. Heat generated in these blocks is thus conducted away from the IC die. In an embodiment, these selected locations can be designed based on the power map of the die for specific applications; the same IC die may have different interposer coupling locations when power maps are different for different applications. This may happen when different functional blocks on the die are powered up and powered down depending on the application.

Embodiments are applicable to all types of IC device packages, such as plastic ball grid array (PBGA), fine pitch ball grid array (BGA), land grid array (LGA), pin grid array (PGA), post-molded plastic leadframe packages such as quad flatpack (QFP) and no-lead quad flatpack (QFN) package or micro leadframe package (MLP). Embodiments include die up and die down configurations with wire bond and/or flip chip connections. This list of example packages and configurations is not intended to be limiting, the technology can be implemented in all packages encapsulated with molded plastic to provide on-chip hotspot cooling.

Example Embodiments: Coupling an Interposer to an IC Die

Figure 3A:
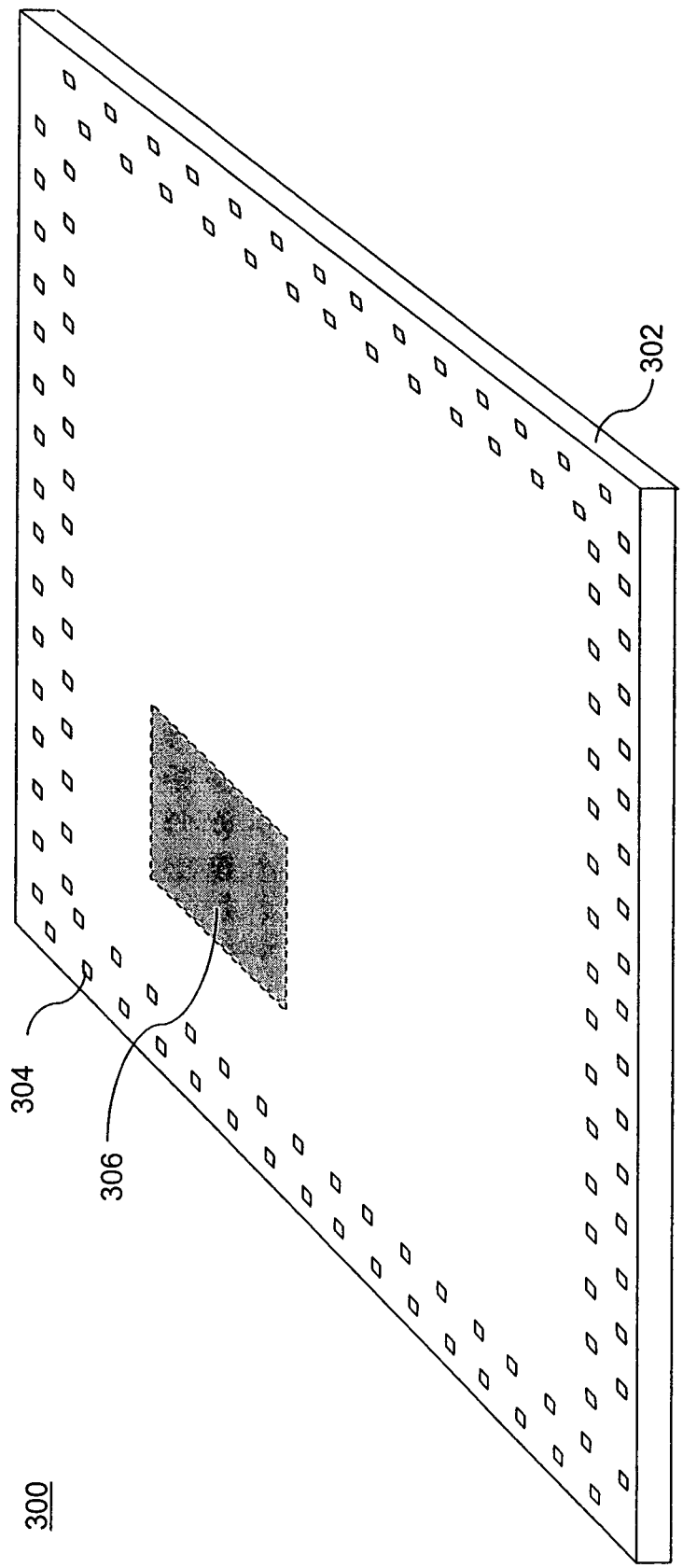
FIGS. 3A-3H illustrate an IC die, nodules and an interposer, according to exemplary embodiments of the invention.

FIG. 3A shows an example integrated circuit (IC) die 302 with at least one hotspot 306. One hotspot 306 is shown for illustration, but an IC die 302 may have multiple hotspots 306. The locations of one or more hotspot 306 may be predicted based on the power map of a die 302 and/or by using power consumption and thermal simulations together. The same die 302 may have different power maps depending on the application, i.e., die 302 may have different blocks powered up and powered down once it is assembled and installed. Thus the at least one hotspots 306 may be in different locations even on the same die 302.

In an embodiment, die 302 has wirebond contact pads 304. In another embodiment, die 302 is intended for a flip chip application, and has no wirebond contact pads 304. In a further embodiment, die 302 is configured for both wirebond and flip chip interconnections. Contact pads 304 are used to input and/or output signals to and from the circuitry formed on or internal to die 302. As shown in FIG. 3A, contact pads 304 used for wirebond are typically arranged in perimeter areas of the surface of die 302, such as in rows/rings, for close access by wirebonds.

Figure 3B:
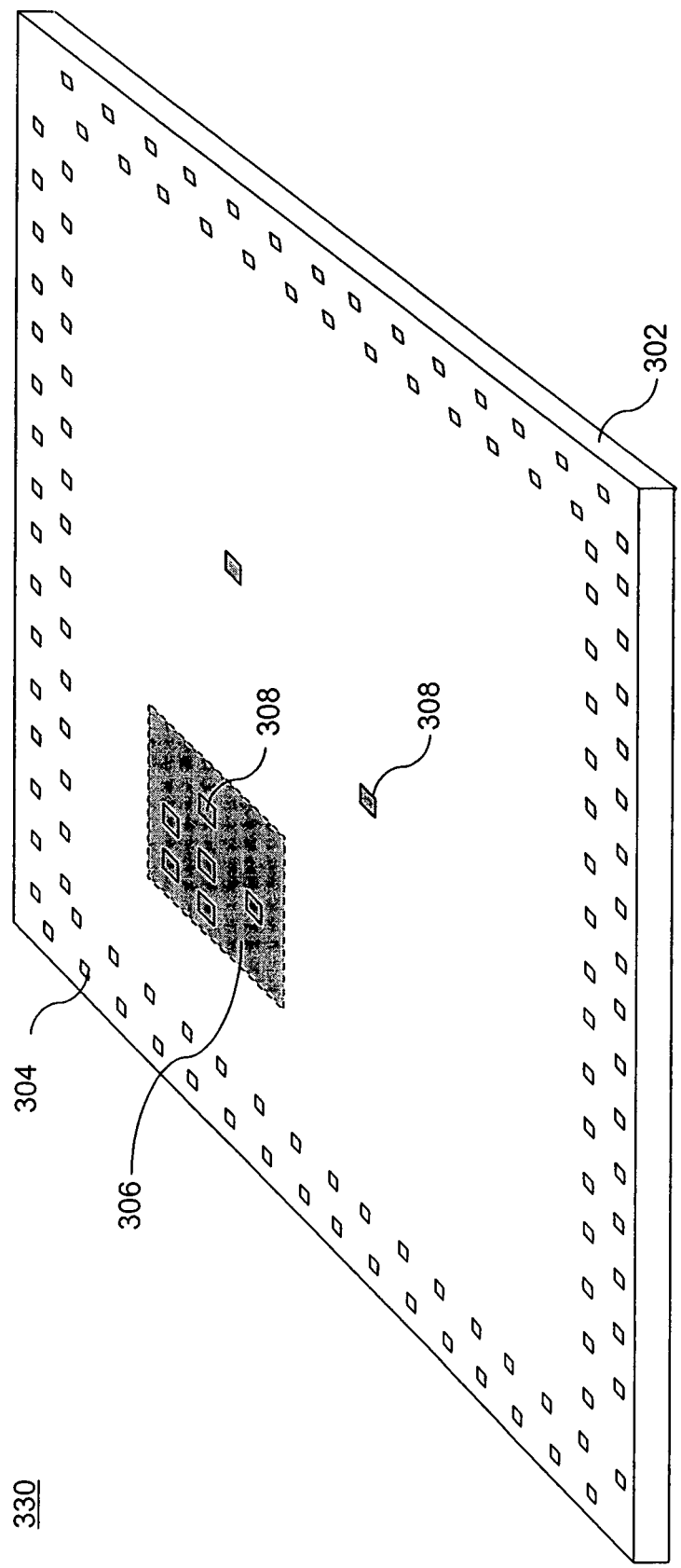

FIG. 3B illustrates an example embodiment of die 302 with interposer contact pads 308. Contact pads 308 are typically not associated with (e.g., an electrical contact for) an electrical signal of die 302, as are contact pads 304. However, in an embodiment, one or more contact pads 308 may be associated with an electrical signal of die 302. Furthermore, contact pads 308 are typically outside of a region of die 302 where contact pads 304 are present. For example, as shown in FIG. 3B, contact pads 308 are centrally located in the surface of die 302, outside of the perimeter areas of die 302 where wirebond contact pads 304 are located (for wirebonding purposes). However, in an embodiment, one or more contact pads 308 may be located in the vicinity of contact pads 304.

Interposer contact pads 308 may be located inside or outside any hotspots 306. In an embodiment, at least some of contact pads 308 are located inside hotspots 306. As described herein, contact pads 308 are located in hotspots 306 to provide a mount point for a conduit for conducting heat from hotspots 306 to a heat spreader. In an embodiment, one or more of contact pads 308 are located outside of hotspots 306 in order to provide a stable mount (in conjunction with contact pads 308 located in hotspots 306) for a heat spreader. In an embodiment, interposer contact pads 308 are placed at locations that are design and application specific for die 302. Any number of contact pads 308 may be present, depending on die 302 and/or the desired application.

Figure 3C:
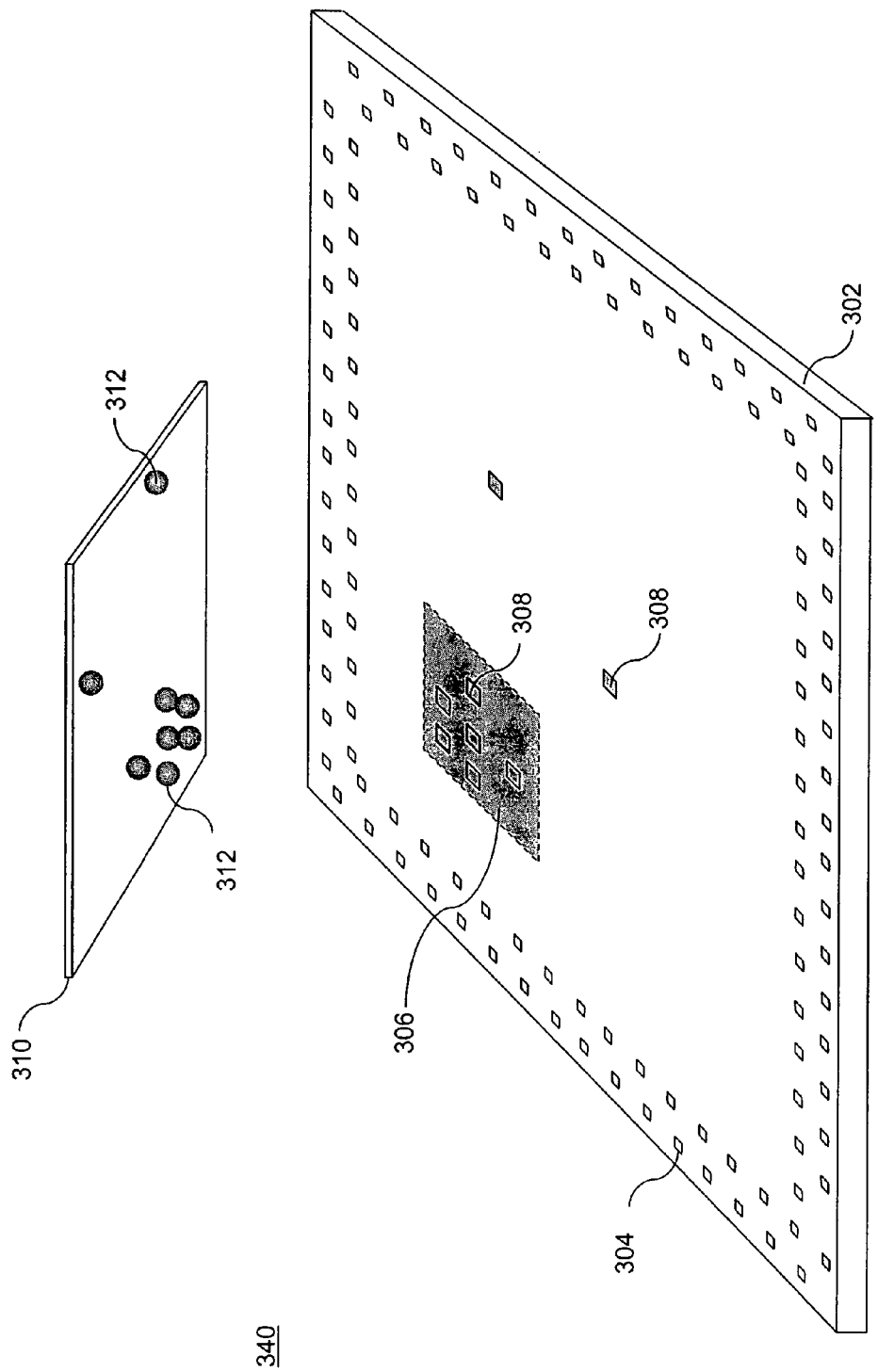
Figure 3D:
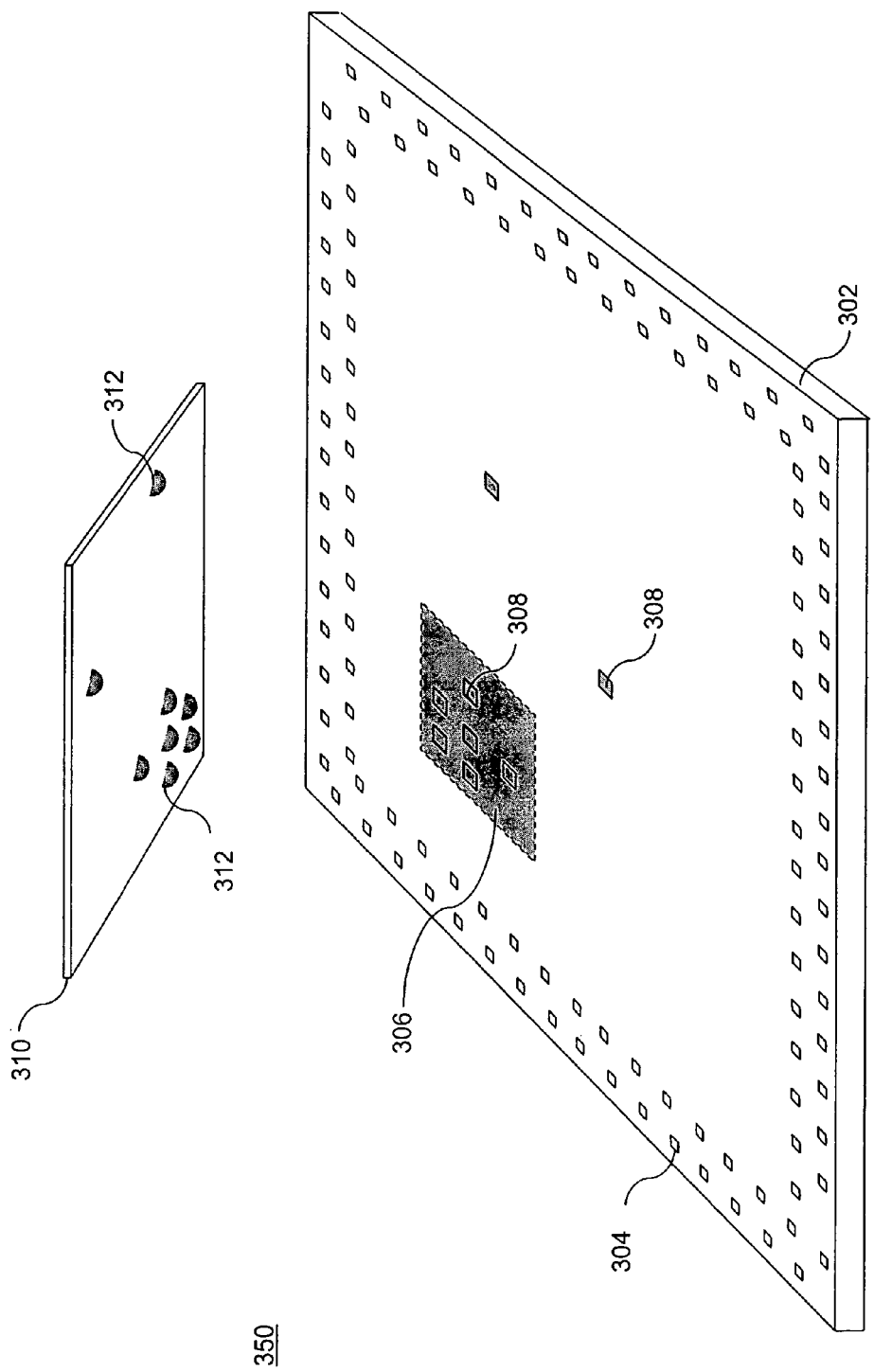
Figure 3E:
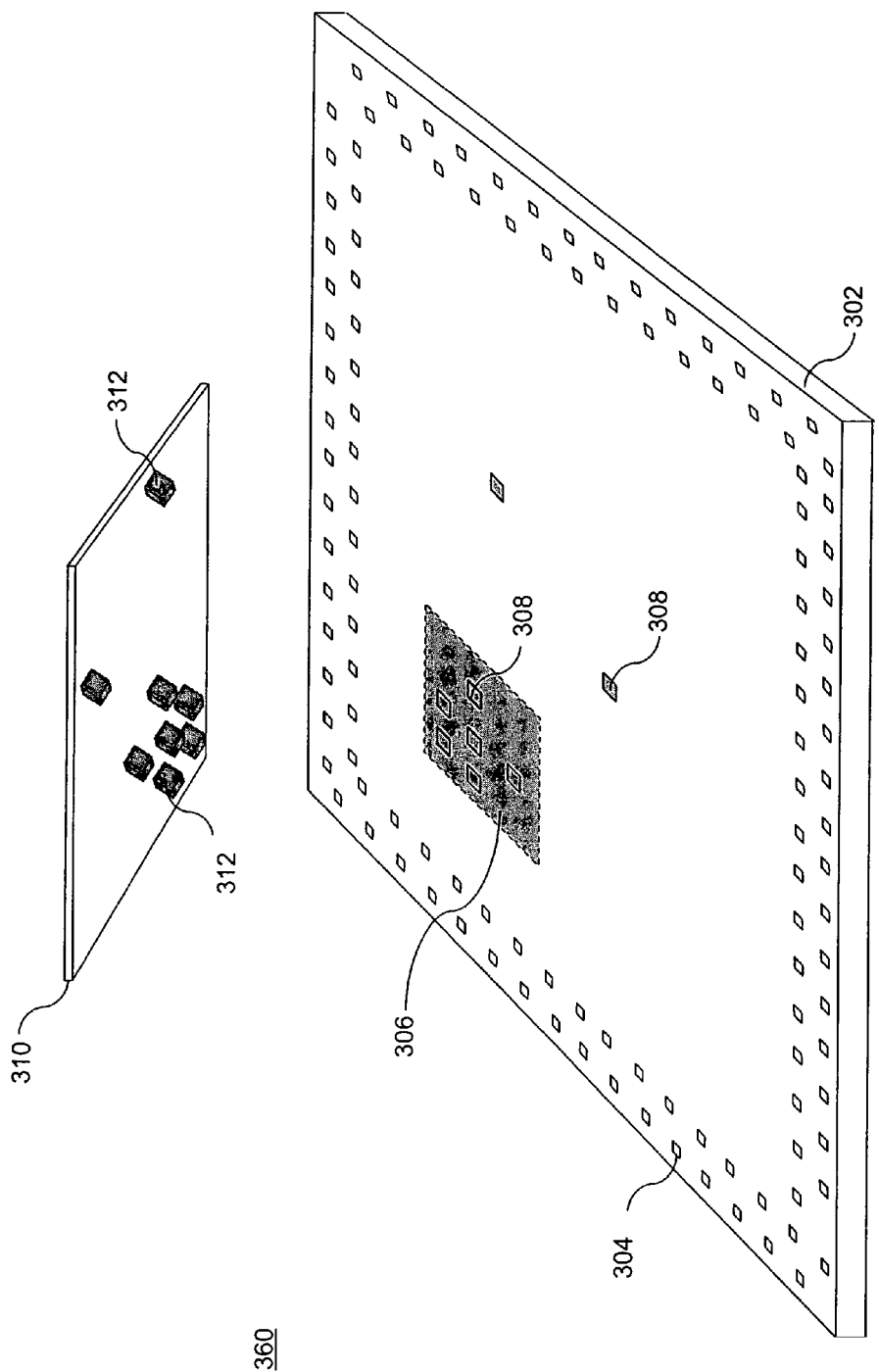
Figure 3F:
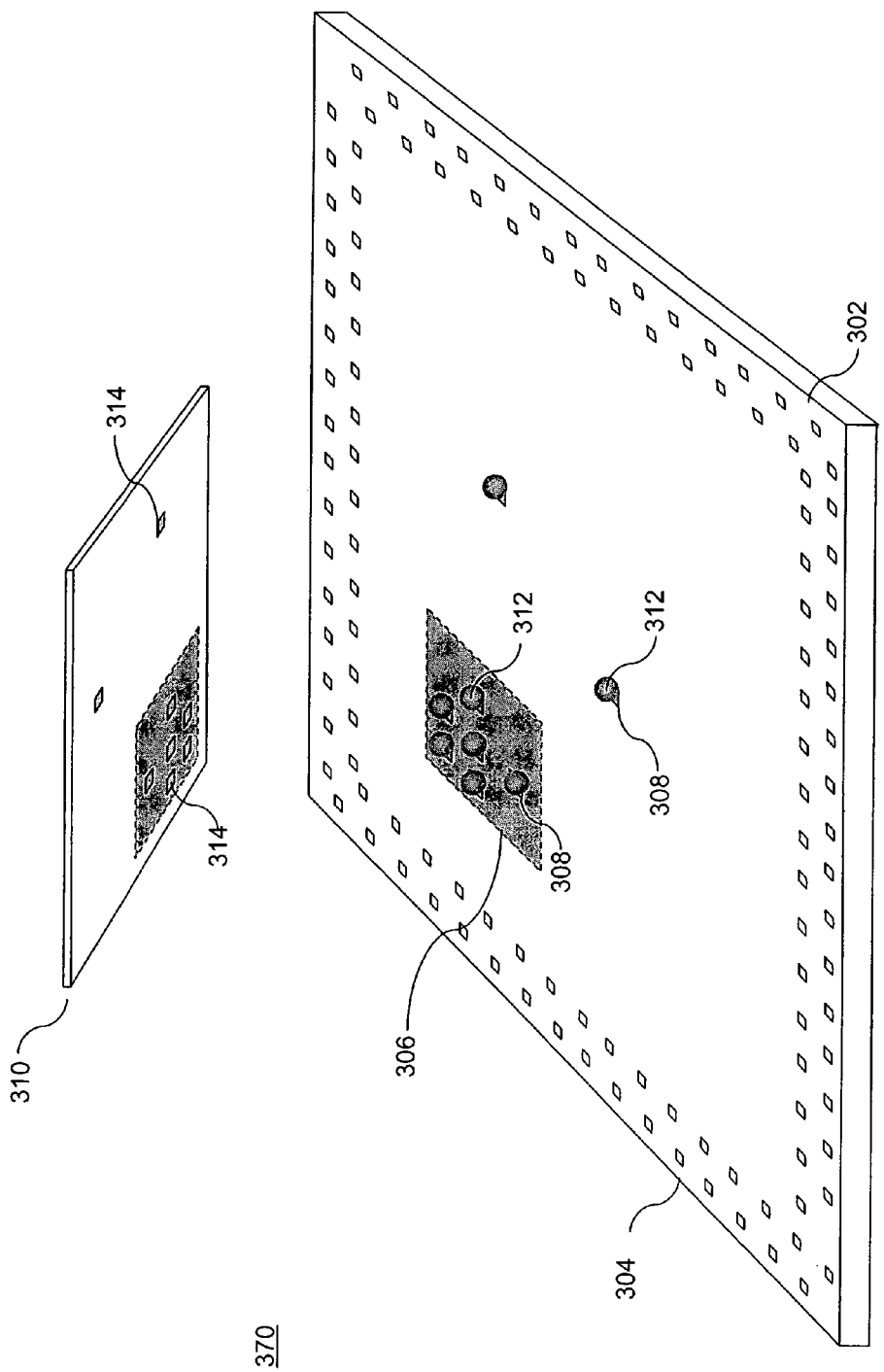

FIG. 3C illustrates an embodiment of interposer 310 having nodules 312 attached at locations that mirror the locations of interposer contact pads 308 on die 302. In embodiments, nodules 312 may be balls, bumps, or blocks, as illustrated in FIGS. 3C-3E, or other irregular or regular shapes. In an alternative embodiment, nodules 312, whether balls, bumps, or blocks, are attached to die 302 rather than to interposer 310, as illustrated in FIG. 3F.

Figure 3G:
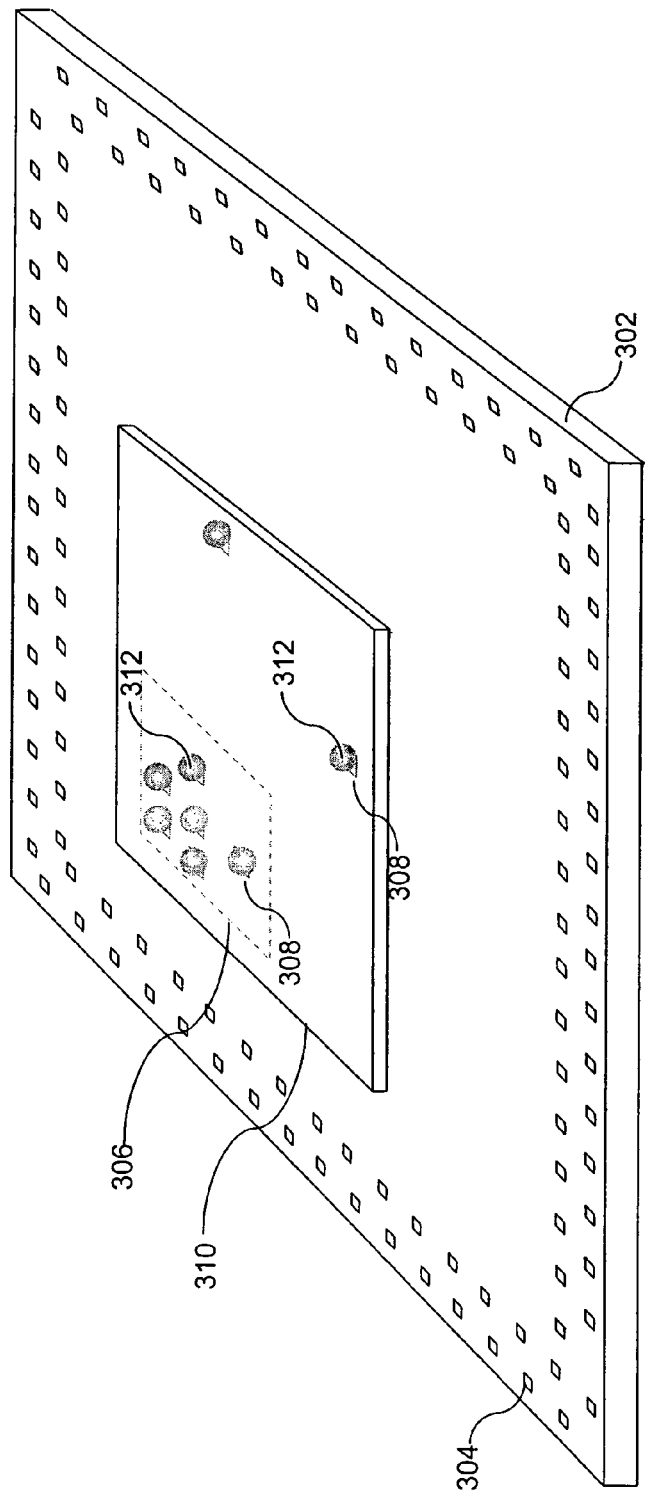

Heat generated in die 302 at hotspots 306 is conducted to interposer 310 via a short conductive path provided by nodules 312 attached to contact pads 308 in hotspots 306. In an embodiment illustrated by FIG. 3G, interposer 310 is coupled to die 302 at interposer contact pads 308, through nodules 312. In an embodiment not shown, the interposer is coupled directly to die 302 at interposer contact pads 308 without nodules 312.

Figure 3H:
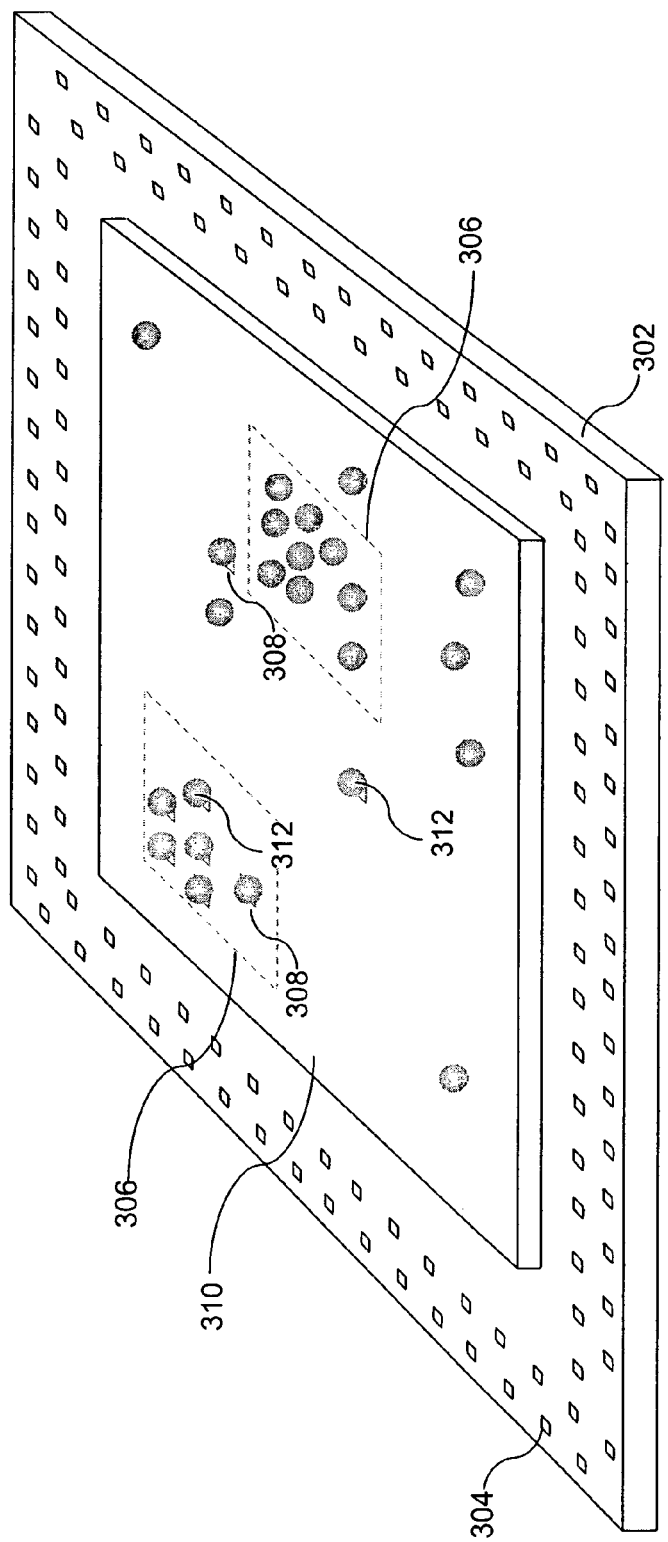

FIG. 3H illustrates an embodiment with more than one hotspot 306. Interposer 310 is coupled to die 302 through nodules 312 at interposer contact pads 308.

Example Interposer and Nodule Embodiments

Figure 4B:
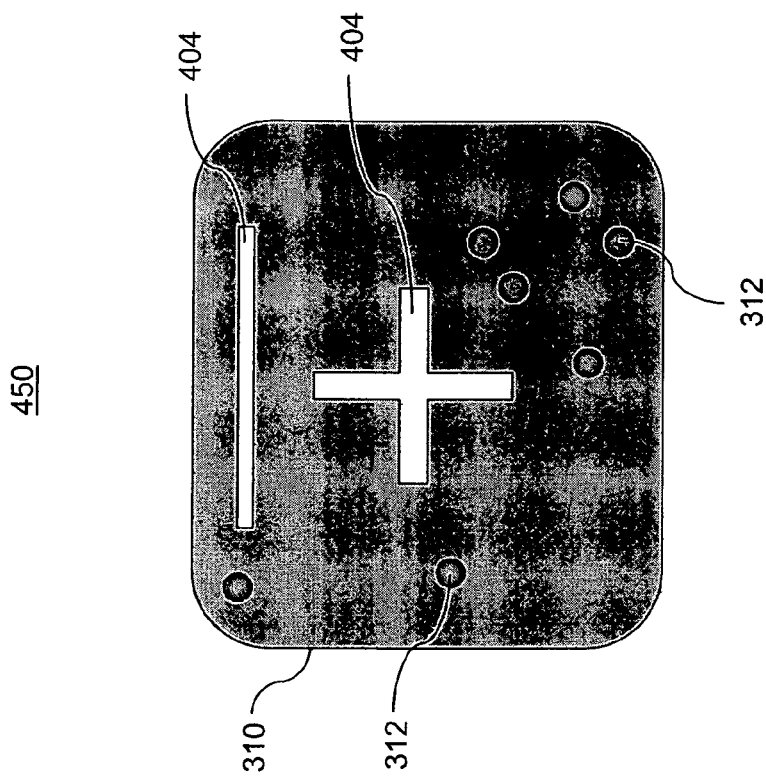
FIGS. 4A-4B illustrate interposers, according to example embodiments of the invention.
Figure 4A:
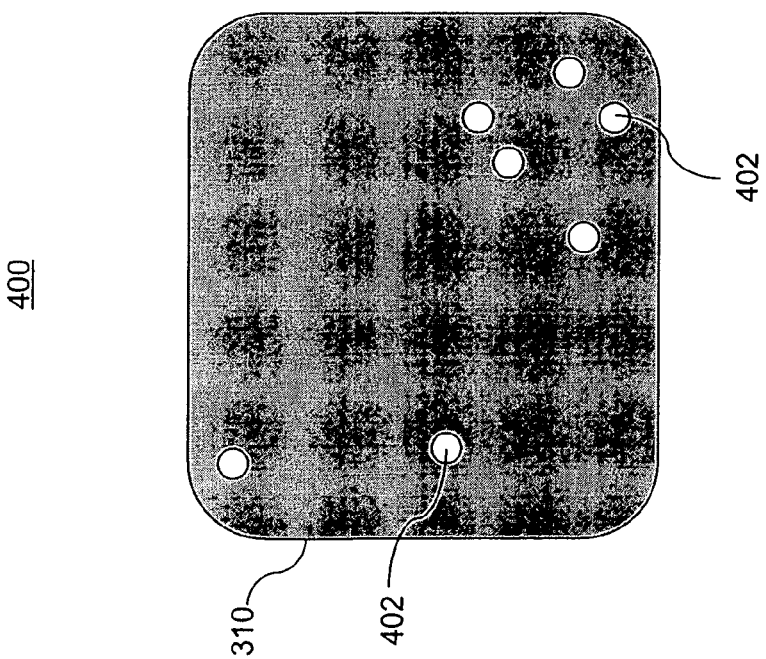

FIG. 4A illustrates an interposer 400, which is an example embodiment of interposer 310. FIG. 4A shows interposer 400 having a planar, rectangular shape (e.g., with rounded corners). However, embodiments of interposer 400 may have other shapes. Interposer 310 may be configured according to the corresponding IC die design and/or may be application specific. As a result, the shape of interposer 400 may non-planar and/or non-rectangular. For example, interposer 310 may be round, square, rectangular, hat-shaped, a concave or convex "soup" bowl shape, or other regular or irregular, planar or non-planar shapes.

In an embodiment, interposer 400 is thermally conductive. In an embodiment, interposer 400 is also electrically conductive. In some embodiments, interposer 400 may be composed of a metal such as copper, copper alloys (such as those used for leadframe packages, e.g., C151, C194, EFTEC-64T, C7025, etc.), aluminum, other metal alloys and metallic materials, ceramic, organics (bismaleimide triazine (BT), fire retardant type 4 (FR4), etc.), and less conductive materials such as dielectric materials. Interposer 400 may also be made of flexible tape substrate such as a polyimide tape substrate with or without one or more metal foil layers. Conventional as well as high density stiff substrates, including BT and FR4 based substrates, can also be used for interposer 400.

In an embodiment illustrated in FIG. 4A, interposer 400 may have a surface coating 402 applied to selected locations. This surface coating 402 may, for example, enhance coupling with nodules 312 or directly with an IC die. Surface coating 402 may be one or more of a variety of materials, including carbon, a metal, an oxide, etc.

FIG. 4B shows an interposer 450, which is another example embodiment of interposer 310, having one or more openings 404 to allow mold compound or underfill material to flow through and fill the gap between interposer 450 and an IC die. Although shown as slot shaped and cross shaped in FIG. 4B, openings 404 may have any shape, including round, slot, rectangular, square, and other regular and irregular shapes. In an embodiment, cutouts may be made in interposer 450 or on an edge of interposer 450 to facilitate wire bonding. In another embodiment, mold locking tabs or notches may be patterned on interposer 450.

In an embodiment, interposer 310 is coupled to an IC die through nodules 312. Nodules 312 may be bumped onto an IC die or they may be attached to interposer 310. FIG. 4B illustrates an embodiment where nodules 312 are bumped onto interposer 450. Nodules 312, whether bumped on interposer 310 or onto an IC die, have some measure of thermal conductivity. In an embodiment, nodules 312 are thermally and electrically conductive.

Embodiments of nodules 312 may be in the shape of balls, truncated spheres, bumps, blocks, cones, columns, pillars, or other shapes. Nodules 312 may be comprised of solder, gold, copper, aluminum, alloys, solder coated columns, polymer, epoxy, adhesive, or other materials. Nodules 312 may be comprised of a base material (e.g., aluminum, copper, alloy, etc.) with a second material (e.g. solder, epoxy, gold, alloy, etc.) deposited on all or a portion of the base material. In an embodiment, the second material may promote mechanical attachment, thermal coupling, and/or that electric coupling between interposer 310 and an IC die.

Figure 5B:
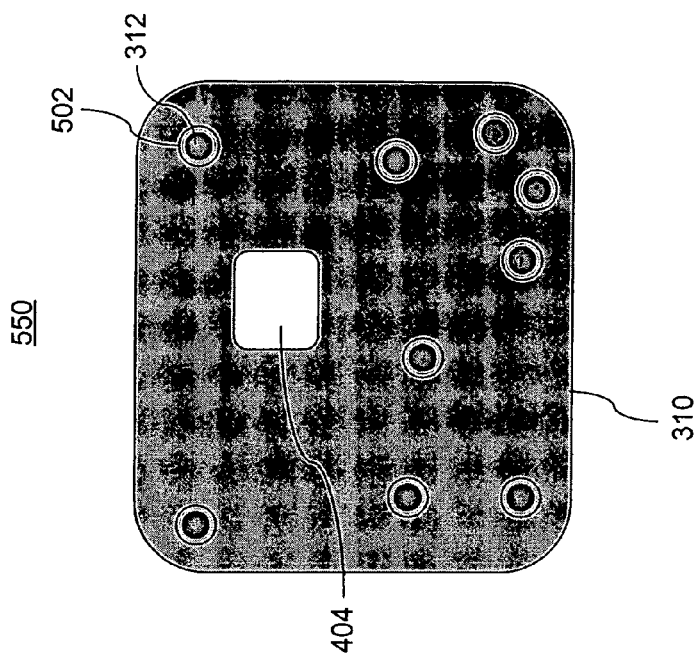
FIGS. 5A-5B illustrate an interposer having pillars, according to exemplary embodiments of the invention.
Figure 5A:
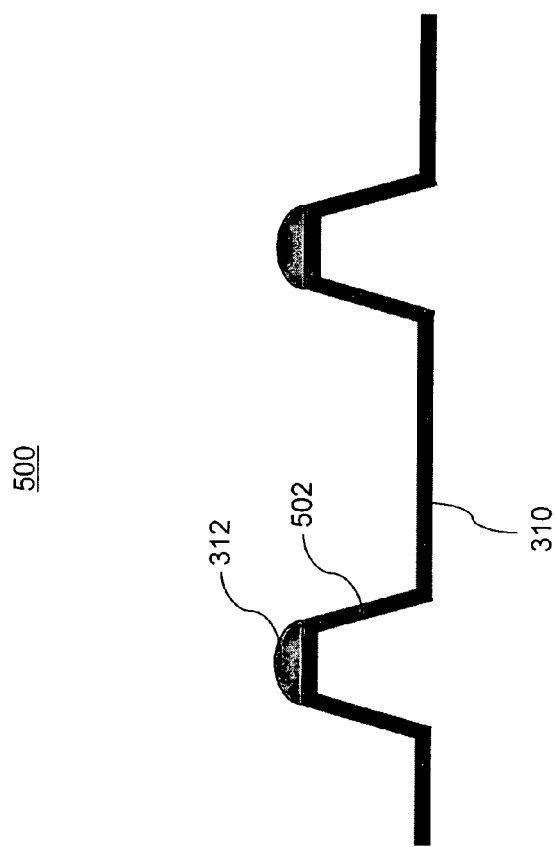

FIGS. 5A and 5B illustrate an interposer 500, which is an example embodiment of interposer 310, including posts 502 topped with nodules 312. FIG. 5A shows a cross section of interposer 310 with posts 502, topped with nodules 312. FIG. 5B shows a front view of an embodiment with an opening 404 in addition to posts 502 topped with nodules 312. Post 502 is shown in FIG. 5A as hollow, being open at a bottom surface of interposer 310, and as being frustum shaped. Posts 502 may be formed in any shape, such as a column, pyramid, cone, and/or a frustum of a cone or a pyramid. In another embodiment, posts 502 are not topped with nodules 312. In a further embodiment, posts 502 are coated partially or completely with a material (e.g., solder, epoxy, adhesive, or other materials). The coating may promote mechanical attachment, thermal coupling, and/or that electric coupling between interposer 310 and an IC die.

Example IC Package Embodiments

This section and the associated figures are intended to illustrate various example embodiments of the invention, but are not intended to be limiting. The following sections describe various integrated circuit (IC) package embodiments, but the invention is equally applicable to other existing or future IC device packages.

For example, FIG. 6A illustrates an example embodiment of a Plastic Ball Grid Array (PBGA) IC package 600 having an IC die 302 coupled to an interposer 310 through nodules 312. Die 302 is connected to substrate 608 by wirebond 614 and die attach material 606. Mold compound 612 encapsulates package 600, including die 302, interposer 310, wirebond 614, and all or part (e.g., a top surface) of substrate 608. Substrate 608 is configured to be connected to a printed wire board (PWB) (not shown) via solder balls 610. FIG. 6B illustrates an embodiment of a PGBA IC package 650 similar to package 600 illustrated by FIG. 6A, with the addition of underfill material 620 between die 302 and interposer 310. Underfill material 620 may be any type of underfill material, and may be used to secure the coupling between interposer 310 and the contact pads on die 310.

FIG. 6C illustrates package 660, which is an example embodiment of a leadframe plastic quad flat package (PQFP), and also having IC die 302 coupled to interposer 310 through nodules 312. Die 302 is attached to die attach pad 622 by die attach material 606. Wirebond 614 connects die 302 to leads 616. Mold compound 612 encapsulates package 660, including die 302 and wirebond 614. FIG. 6D illustrates an embodiment of a leadframe package 670 similar to package 660 illustrated by FIG. 6C, with the addition of underfill material 620 between die 302 and interposer 310.

FIG. 6E shows a package 680, which is an example embodiment of a no-lead Quad Flat Package (QFN), also known as a Micro Leadframe Package (MLP) or a Micro Lead Frame (MLF) IC package. In this example, IC package 680 has IC die 302 coupled to interposer 310 through nodules 312. Die 302 is attached to die attach pad 622 by die attach material 606. Wirebond 614 connects die 302 to leads 618 of package 680. FIG. 6F illustrates a similar QFN/MLP/MLF IC package 690, with the addition of underfill material 620 between die 302 and interposer 310.

Figure 7A:
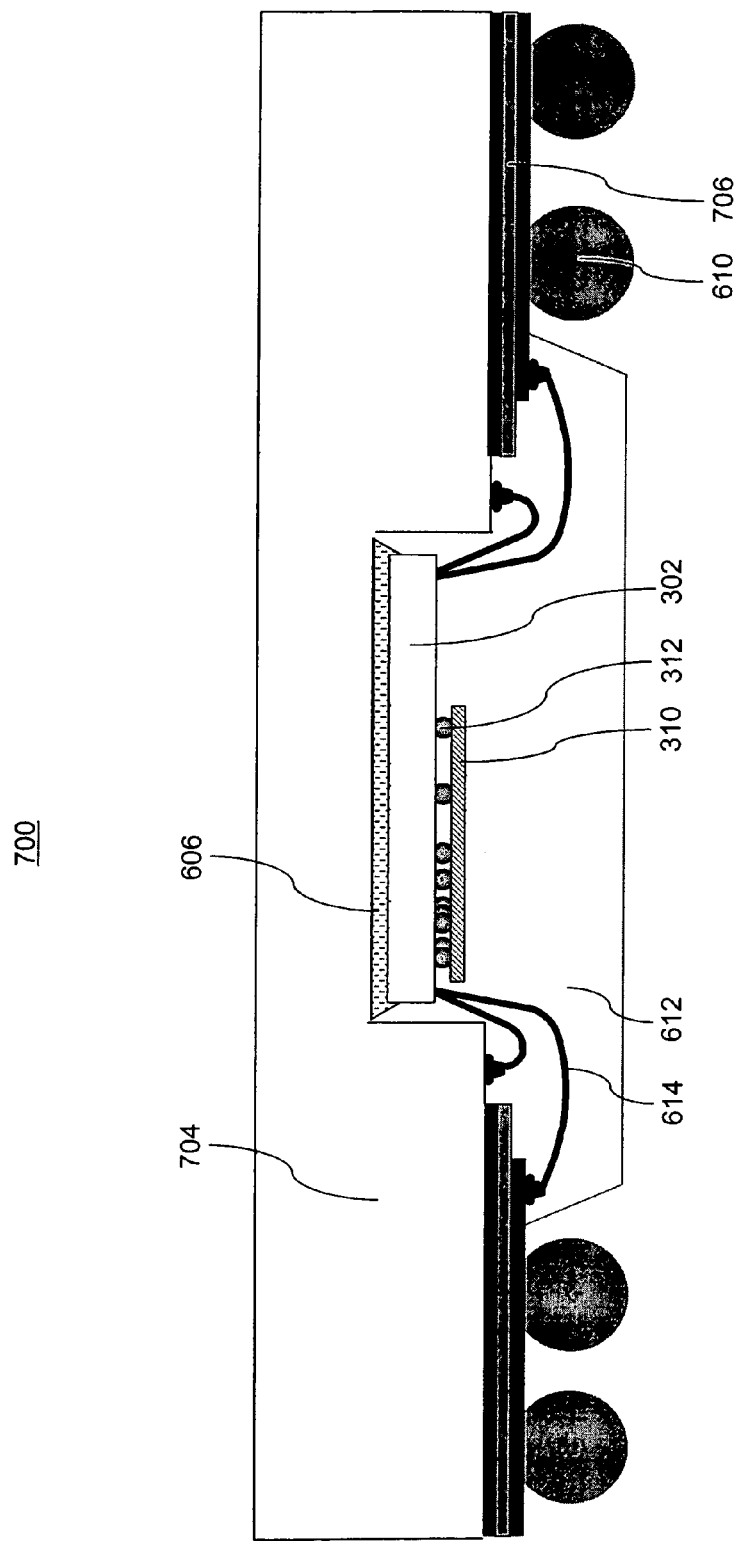
FIGS. 7A-7B illustrate die-down IC packages having an interposer, according to exemplary embodiments of the invention.

Embodiments of the invention include die-down IC packages. For example, FIG. 7A illustrates an example die-down ball grid array (BGA) package 700, having an IC die 302 coupled to an interposer 310 through nodules 312. The area between die 302 and interposer 310 may be filled with an underfill material (not shown). Die 302 is attached to heat spreader 704, and wirebond 614 connects die 302 to substrate 706. Solder balls 610 attach package 700 to a printed wire board (PWB) (not shown). Mold compound 612 encapsulates die 302 and wirebond 614.

Figure 7B:
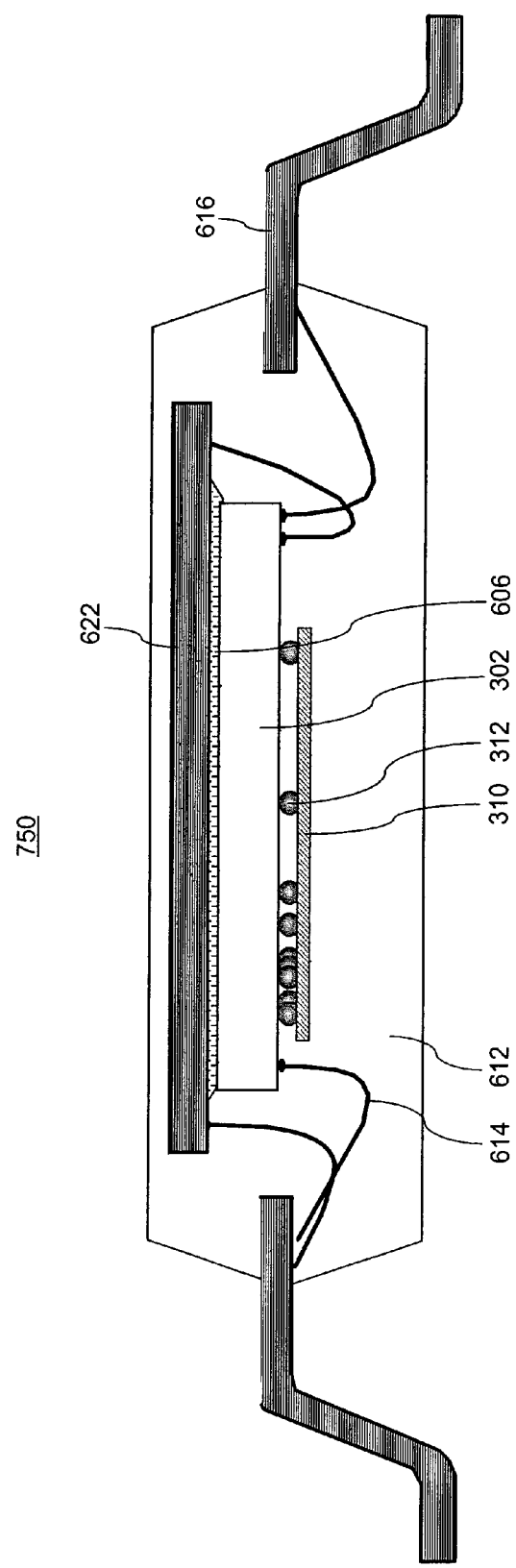

FIG. 7B illustrates an example die-down leadframe IC package 750, having IC die 302 coupled to interposer 310 via nodules 312. Die attach material 606 attaches die 302 to die attach pad 622. Wirebond connects die 302 to leads 616. Underfill material (not shown) may fill the space between die 302 and interposer 310.

Figure 8:
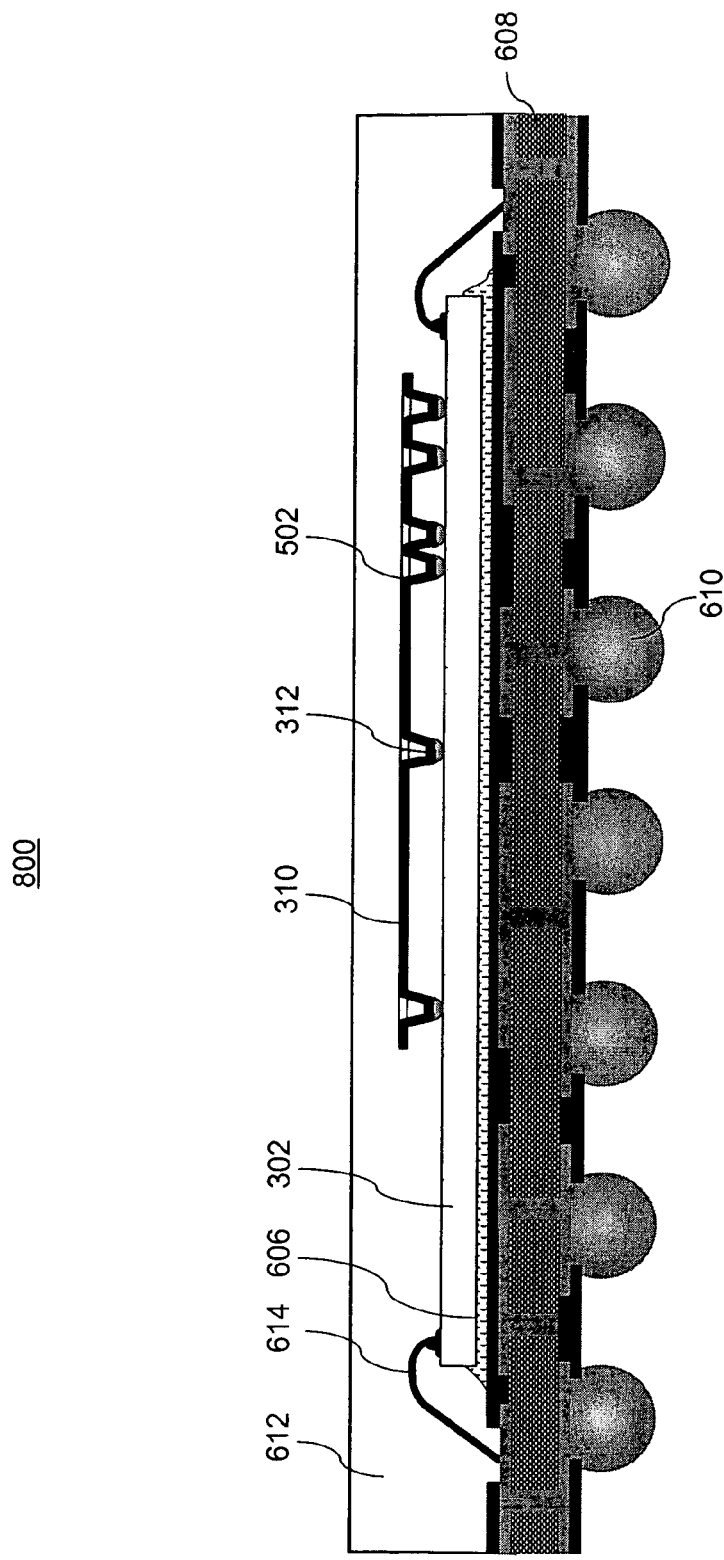
FIG. 8 illustrates an IC package with an interposer having posts, according to an example embodiment of the invention.

As described herein, an interposer 310 may include posts 502. FIG. 8 illustrates a BGA IC package 800 having interposer 310 with posts 502. Interposer 310 is coupled to IC die 302 via nodules 312 at the tips of posts 502. Underfill material (not shown) may fill the space between die 302 and interposer 310. Die 302 is attached to substrate 608 with die attach material 606. Wirebond 614 connects die 302 to substrate 608. Package 800 is encapsulated in mold compound 612, covering die 302, wirebond 614, and all or part of substrate 608. Solder balls 610 are configured to couple package 800 to a printed wire board (not shown). Although FIG. 8 shows an example BGA package 800, embodiments of the invention incorporating interposer 310 with posts 502 include all types of IC packages, including those illustrated in the other figures described herein.

Embodiments of the invention may incorporate various types of heat spreaders. In an embodiment having a heat spreader, the heat spreader may be made of metal such as copper, copper alloys used for leadframe packages (C151, C194, EFTEC-64T, C7025, etc.), aluminum, and other metallic materials. The heat spreader may also be a flexible tape substrate type such as polyimide tape substrate with one metal foil layer or two metal foil layers laminated on polyimide film. The heat spreader may also be made of thermally conductive but electrically non-conductive materials such as thermally conductive ceramic materials. In an embodiment, mold compound completely encapsulates the heat spreaders. In other embodiments, the heat spreader is left partially or fully exposed.

For example, FIG. 9A illustrates an example embodiment of a die-up BGA IC package 900 having IC die 302 coupled to interposer 310 via nodules 312. Underfill material (not shown) may fill the space between die 302 and interposer 310. Die attach material 606 attaches die 302 to a substrate 608 and wirebond 614 connects die 302 to substrate 608. Package 900 also incorporates a drop-in heat spreader 902, which may or may not be completely encapsulated by mold compound 612. Heat spreader 902 is "cap"-shaped, including a cavity 906, and a rim 908 formed around a periphery of heat spreader 902. Mold compound 612 encapsulates package 900, including die 302, wirebond 614, and all or part of substrate 608. Solder balls 610 are configured to couple package 900 to a printed wire board (PWB) not shown. FIG. 9B illustrates a BGA package 950, generally similar to package 900, except that package 950 incorporates a heat spreader 904. Heat spreader 904 is planar. Embodiments may incorporate various other heat spreader designs, as would be apparent to one of skill in the art.

Similarly, FIG. 9C illustrates a package 960, which is a leadframe QFP type of IC package, and further having die 302 coupled to interposer 310 via nodules 312. Underfill material (not shown) may fill the space between die 302 and interposer 310. Die 302 is attached to die attach pad 622 by die attach material 606. Die 302 is connected to leads 616 by wirebond 614. Package 960 incorporates a drop-in heat spreader 902. Mold compound 612 encapsulates package 960, including die 302 and wirebond 614. Drop-in heat spreader 902 may or may not be completely encapsulated by mold compound 612. Embodiments may incorporate various other heat spreader designs, as would be apparent to one of skill in the art.

FIG. 9D illustrates an example die-down BGA package 970, incorporating a heat slug 906. Heat slug 906 may be configured to be coupled to a PWB (not shown). Embodiments may incorporate various other heat slug 906 designs, as would be apparent to one of skill in the art. Package 970 includes die 302 coupled to interposer 310 via nodules 312. Underfill material (not shown) may fill the space between die 302 and interposer 310. Die 302 is attached to heat spreader 704 by die attach material 606. Wirebond 614 connects die 302 to substrate 706. Mold compound 612 encapsulates wirebond 614 and die 302. Solder balls 618 are configured to be coupled to a PWB (not shown).

In an embodiment, an interposer is coupled to a heat spreader by a material other than mold compound. For example, FIG. 10A illustrates an example embodiment of a die up BGA package 1000 having an IC die 302 coupled to an interposer 310 via nodules 312. Underfill material (not shown) may fill the space between die 302 and interposer 310. Die attach material 606 attaches die 302 to substrate 608 and wirebond 614 connects die 302 to substrate 608. Package 900 also incorporates a drop-in heat spreader 902, which is coupled to interposer 310 by heat slug 1002. Embodiments may incorporate various other heat spreader designs, as would be apparent to one of skill in the art. Mold compound encapsulates package 1000, including die 302, wirebond 614, and all or part of substrate 608. Heat spreader 902 and heat slug 1002 may or may not be completely encapsulated by mold compound 612. Solder balls 610 are configured to couple package 900 to a PWB (not shown).

Similarly, FIG. 10B illustrates a leadframe QFP IC package 1010, having die 302 coupled to interposer 310 via nodules 312. Underfill material (not shown) may fill the space between die 302 and interposer 310. Die 302 is attached to die attach pad 622 by die attach material 606. Die 302 is connected to leads 616 by wirebond 614. Package 1010 incorporates a drop-in heat spreader 902. Embodiments may incorporate various other heat spreader designs, as would be apparent to one of skill in the art. Mold compound 612 encapsulates package 1010, including die 302 and wirebond 614. Drop-in heat spreader 902 may or may not be completely encapsulated by mold compound 612.

FIGS. 10C and 10D illustrate example embodiment IC packages 1040 and 1050 generally similar to packages 1000 and 1010 in FIGS. 10A and 10B respectively, except that solder balls 1004 couple heat spreader 902 to interposer 310.

In another example embodiment, FIG. 10E illustrates a die-down BGA package 1060, incorporating heat slug 1006 and solder balls 1004. Heat slug 1006 is mounted to interposer 310. Solder balls 1004 are configured to couple heat slug 1006 to a circuit board, such as a printed wiring board (PWB) (not shown in FIG. 10E), when package 1060 is mounted to the circuit board. Embodiments may incorporate various other configurations for heat slug 1006, as would be apparent to one of skill in the art. Package 1060 includes die 302 coupled to interposer 310 via nodules 312. Underfill material (not shown) may fill the space between die 302 and interposer 310. Die 302 is attached to heat spreader 704 by die attach material 606. Wirebond 614 connects die 302 to substrate 706. Mold compound 612 encapsulates wirebond 614 and die 302. Solder balls 618 are configured to be coupled to a PWB (not shown). Embodiments incorporate other heat slug 1006 implementations, as would be apparent to one of skill in the art. For example, in the example IC package 1070 illustrated in FIG. 10F, heat slug 1006 is configured to couple directly to a circuit board, and thus solder balls 1004 are not necessary.

Example Embodiments: Methods of Assembly

Figure 11A:
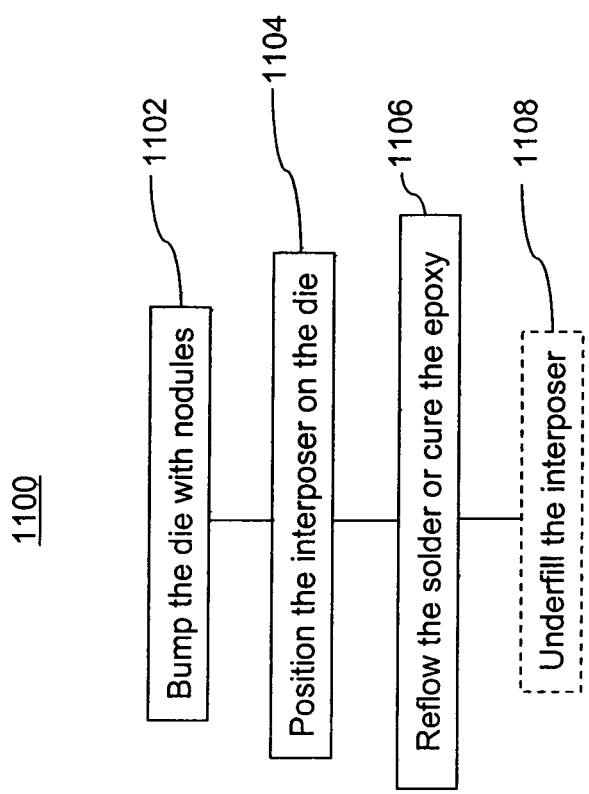
FIGS. 11A-11B illustrate flowcharts describing methods of manufacture, according to example embodiments of the invention.
Figure 11B:
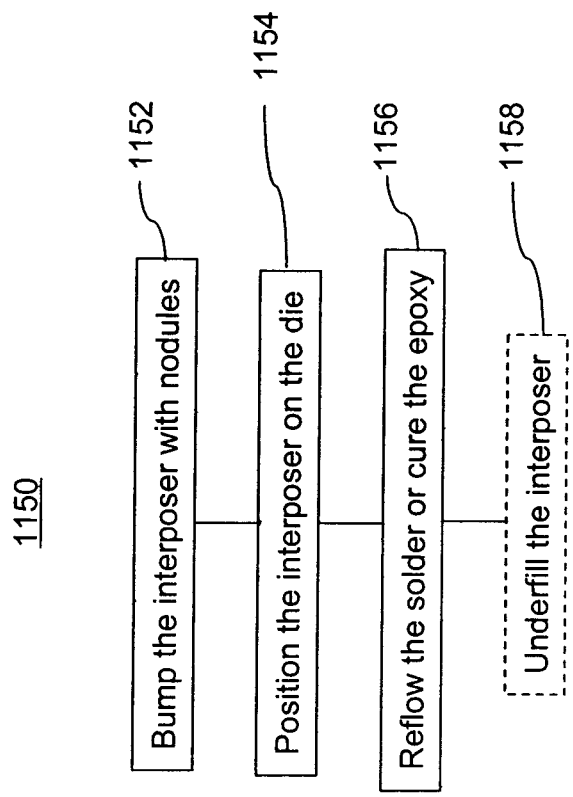

Example embodiments for assembling a die and interposer arrangement are illustrated in FIGS. 11A-11B. FIG. 11A shows a flowchart 1100, and FIG. 11B shows a flowchart 1150. As described elsewhere herein, the interposer and die are typically components of a larger IC package. Incorporation of the assembled die and interposer into the IC package embodiments illustrated elsewhere herein will be apparent to a person of skill in the relevant art based on the following discussion and on the teachings elsewhere herein. The steps of FIGS. 11A-11B do not necessarily have to occur in the order shown, as will be apparent to a person of skill in the relevant art. Other structural and operational embodiments will be apparent to persons skilled in the art based on the following discussion.

Referring to FIG. 11A, flowchart 1100 describes a process of assembly where the die is bumped with nodules. In step 1102, the die is bumped with at least one nodule. Example nodules are shown in FIGS. 3C-3E, as nodules 312. In embodiments, nodules 312 may be balls (e.g., solder balls), bumps, or blocks, as illustrated in FIGS. 3C-3E, or may have other shapes. As described elsewhere herein, such as in conjunction with FIG. 3F, the nodules may be located on contact pads within or outside of hotspots of a die.

In step 1104, the interposer is placed on the die so that the nodules on the die are touching the corresponding locations on the interposer. For example, as described with respect to FIG. 4A, the interposer may have a surface coating applied to the locations which couple to the nodules.

In step 1106, the interposer is coupled to the die. If the nodules are an epoxy, adhesive, or similar material, then the nodules are allowed to cure. If the nodules are solder, solder-based, solder-coated, or of similar composition, the nodules are reflowed. Other nodule compositions may require equivalent reflow or curing to complete the coupling.

In optional step 1108, an underfill material is placed between the die and the interposer. For example, the underfill material is underfill material 620 shown in FIG. 6B. In an example, an underfill process used to deposit underfill material is the same as those used in conventional flip chip technology.

Referring to FIG. 11B, flowchart 1150 describes a process of assembly where the interposer is bumped with nodules. In step 1152, the interposer is bumped with at least one nodule. Example nodules are shown in FIGS. 3C-3E, as nodules 312. In embodiments, nodules 312 may be balls (e.g., solder balls), bumps, or blocks, as illustrated in FIGS. 3C-3E, or may have other shapes. As described elsewhere herein, such as in conjunction with FIG. 3F, the nodules may be located on contact pads within or outside of hotspots of a die.

In step 1154, the interposer is placed on the die so that the nodules on the interposer are touching to the corresponding interposer contact pads on the die.

In step 1156, the interposer is coupled to the die. If the nodules are an epoxy, adhesive, or similar material, then the nodules are allowed to cure. If the nodules are solder, solder-based, solder-coated, or of similar composition, the nodules are reflowed. Other nodule compositions may require equivalent reflow or curing to complete the coupling.

In optional step 1158, an underfill material is placed between the die and the interposer. For example, the underfill material is underfill material 620 shown in FIG. 6B. In an example, an underfill process used to deposit underfill material is the same as those used in conventional flip chip technology.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device package, comprising:
    an IC die having a plurality of functional blocks and a set of contact pads located on a first surface of the IC die at a plurality of hotspots associated with the plurality of functional blocks, wherein a spacing between a contact pad of the set of contact pads and a first adjacent contact pad of the set of contact pads is different from a spacing between the contact pad and a second adjacent contact pad of the set of contact pads, wherein the plurality of hotspots are locations on the IC die that have temperatures that are higher than an average temperature of the IC die during operation of the IC die;
    a thermally conductive interposer having first and second surfaces, wherein the first surface of the thermally conductive interposer is thermally coupled to each contact pad of the set of contact pads; and
    a plurality of wirebond contact pads that are located around a perimeter of the IC die.

2. The package of claim 1, further comprising:
    an underfill material that substantially fills a space between the first surface of the IC die and the first surface of the thermally conductive interposer.

3. The package of claim 1, wherein the first surface of the thermally conductive interposer has at least one post.

4. The package of claim 1, wherein the thermally conductive interposer is electrically conductive.

5. The package of claim 1, wherein the first surface of the thermally conductive interposer is electrically coupled to the set of contact pads.

6. The package of claim 1, wherein the package is a die-down IC device package.

7. The package of claim 1, wherein the package is a die-up IC device package.

8. The package of claim 1, wherein the second surface of the thermally conductive interposer is configured to be coupled to a printed circuit board (PCB).

9. The package of claim 1, wherein a second surface of the IC die that opposes the first surface of the IC die is coupled to a substrate or a die-attach pad.

10. The package of claim 1, wherein the plurality of wirebond contact pads is configured to input and/or output signals to and from the IC die.

11. The package of claim 1, further comprising:
    at least one thermally conductive nodule, wherein the first surface of the thermally conductive interposer is coupled to the IC die through the at least one nodule.

12. The package of claim 11, wherein the at least one nodule is electrically conductive.

13. The package of claim 1, further comprising:
    a heat spreader, where the heat spreader is attached to the second surface of the thermally conductive interposer.

14. The package of claim 13, wherein the heat spreader is electrically coupled to the second surface of the thermally conductive interposer.

15. The package of claim 1, further comprising:
a heat slug, wherein the heat slug is attached to the second surface of the thermally conductive interposer.

16. The package of claim 15, wherein the heat slug is electrically coupled to the second surface of the thermally conductive interposer.

17. The package of claim 15, wherein the heat slug is configured to be coupled to a printed circuit board (PCB).

18. The package of claim 1, further comprising:
a thermal interconnect coupled between the first surface of the thermally conductive interposer and the contact pad.

19. The package of claim 18, wherein the thermal interconnect is a solder ball.

20. The package of claim 18, wherein the thermal interconnect is a block.

21. The package of claim 18, wherein the thermal interconnect is a solder bump.

22. The package of claim 1, further comprising:
a substrate coupled to a second surface of the IC die, wherein the second surface of the IC die opposes the first surface of the IC die;
wherein the set of contact pads is a first set of contact pads, wherein the IC die further comprises a second set of contact pads arranged uniformly, and wherein the second set of contact pads is coupled to the substrate.

23. The package of claim 22, wherein the second set of contact pads is coupled to the substrate through respective wirebonds.

24. The package of claim 22, wherein the first set of contact pads is located in a central portion of the first surface of the IC die, and
wherein the second set of contact pads is located along a periphery of the first surface of the IC die.

* * * * *